(12) United States Patent
Roy et al.

(10) Patent No.: US 12,320,829 B2
(45) Date of Patent: Jun. 3, 2025

(54) ON-STATE VOLTAGE MEASUREMENT OF HIGH-SIDE AND LOW-SIDE POWER TRANSISTORS IN A HALF-BRIDGE FOR IN-SITU PROGNOSTICS

(71) Applicant: University of North Carolina Charlotte, Charlotte, NC (US)

(72) Inventors: Chondon Roy, Charlotte, NC (US); James Gafford, Charlotte, NC (US); Namwon Kim, Knoxville, TN (US); Babak Parkhideh, Charlotte, NC (US)

(73) Assignee: University of North Carolina At Charlotte, Charlotte, NC (US)

( * ) Notice: Subject to any disclaimer, the term of this patent is extended or adjusted under 35 U.S.C. 154(b) by 301 days.

(21) Appl. No.: 17/870,512

(22) Filed: Jul. 21, 2022

(65) Prior Publication Data
US 2023/0314487 A1 Oct. 5, 2023

Related U.S. Application Data

(60) Provisional application No. 63/203,405, filed on Jul. 21, 2021.

(51) Int. Cl.
*G01R 19/165* (2006.01)
(52) U.S. Cl.
CPC ............... *G01R 19/16523* (2013.01)
(58) Field of Classification Search
CPC .............. G01R 19/16523; G01R 31/27; G01R 31/2608; G01R 31/2621; G01R 31/3277; H02M 1/32; H02M 7/53871
(Continued)

(56) References Cited

FOREIGN PATENT DOCUMENTS

CH 714661 A2 * 8/2019 ......... G01R 31/2601

OTHER PUBLICATIONS

Guacci et al.; Translation of CH-714661-A2; Aug. 30, 2019; Translated by Clarivate Analytics (Year: 2019).*
(Continued)

*Primary Examiner* — Eman A Alkafawi
*Assistant Examiner* — Rahul Maini
(74) *Attorney, Agent, or Firm* — Michael I. Angert; LOZA & LOZA, LLP

(57) ABSTRACT

Various examples are provided for on-state voltage sensing for in-situ monitoring and prognostics. In one example, an on-state monitoring circuit includes clamping circuitry including high-side and low-side voltage clamping circuits associated with high-side and low-side switching devices of a half-bridge (HB) leg of an converter, on-state voltage circuitry including high-side and low-side voltage measurement circuits, the high-side and low-side circuits referenced to the positive and negative buses of the converter respectively, and output circuitry including high-side and low-side isolation circuits that provide isolated outputs referenced to a control ground of the converter. In another example, an on-state voltage measurement circuit includes clamping circuitry including high-side and low-side voltage clamping circuits referenced to a common point between high-side and low-side switching devices of a HB leg, on-state voltage circuitry including high-side and low-side voltage measurement circuits and a voltage merger circuit, and output circuitry including an isolation circuit providing a single output containing both high-side on-state voltage and low-side on-state voltage.

14 Claims, 16 Drawing Sheets

(58) Field of Classification Search
USPC .................................................. 324/123 R
See application file for complete search history.

(56) References Cited

OTHER PUBLICATIONS

J. Millán and P. Godignon, "Wide Band Gap power semiconductor devices," 2013 Spanish Conference on Electron Devices, Valladolid, 2013, pp. 293-296.

L. Ferreira Costa and M. Liserre, "Failure Analysis of the dc-dc Converter: A Comprehensive Survey of Faults and Solutions for Improving Reliability," in IEEE Power Electronics Magazine, vol. 5, No. 4, pp. 42-51.

M. Biglarbegian et al., "On condition monitoring of high frequency power GaN converters with adaptive prognostics," 2018 IEEE Applied Power Electronics Conference and Exposition (APEC), 2018, pp. 1272-1279.

J. Millán, P. Godignon, X. Perpiñà, A. Pérez-Tomás, and J. Rebollo, "A Survey of Wide Bandgap Power Semiconductor Devices," IEEE Transactions on Power Electronics, vol. 29, No. 5, pp. 2155-2163, May 2014.

A. J. Lelis, R. Green and D. B. Habersat, "SiC MOSFET reliability and implications for qualification testing," 2017 IEEE International Reliability Physics Symposium (IRPS), Monterey, CA, 2017, pp. 2A-4.1-2A-4.4.

J. Wei, S. Liu, J. Fang, S. Li, T. Li, and W. Sun, "Investigation on degradation mechanism and optimization for SiC power MOSFETs under long-term short-circuit stress," 2018 IEEE 30th International Symposium on Power Semiconductor Devices and ICs (ISPSD), 2018, pp. 399-402.

X. Yang et al., "Degradation Behavior and Defect Analysis for SiC Power MOSFETs Based on Low-Frequency Noise Under Repetitive Power-Cycling Stress," in IEEE Transactions on Electron Devices, Feb. 2021, vol. 68, No. 2, pp. 666-671.

E. Ugur, F. Yang, S. Pu, S. Zhao and B. Akin, "Degradation Assessment and Precursor Identification for SiC MOSFETs Under High Temp Cycling," in IEEE Transactions on Industry Applications, vol. 55, No. 3, pp. 2858-2867.

R. Li, X. Wu, S. Yang and K. Sheng, "Dynamic on-State Resistance Test and Evaluation of GaN Power Devices Under Hard- and Soft-Switching Conditions by Double and Multiple Pulses," in IEEE Transactions on Power Electronics, vol. 34, No. 2, pp. 1044-1053, Feb. 2019.

S. Dusmez, M. Bhardwaj, L. Sun and B. Akin, "In Situ Condition Monitoring of High-Voltage Discrete Power MOSFET in Boost Converter Through Software Frequency Response Analysis," in IEEE Transactions on Industrial Electronics, vol. 63, No. 12, pp. 7693-7702, Dec. 2016.

J. Chen, X. Jiang, Z. Li, H. Yu and J. Wang, "Investigation on Degradation of SiC MOSFET Under Accelerated Stress in PFC Converter," 2019 IEEE Energy Conversion Congress and Exposition (ECCE), 2019, pp. 6174-6178.

Y. Peng, Y. Shen and H. Wang, "A Condition Monitoring Method for Three Phase Inverter Based on System-Level Signal," 2018 IEEE International Power Electronics and Application Conference and Exposition (PEAC), Shenzhen, 2018, pp. 1-5.

Badawi and S. Dieckerhoff, "A new method for dynamic ron extraction of GaN Power HEMTs," PCIM Eur. 2015; Int. Exhib. Conf. Power Electron. Intell. Motion, Renew. Energy Energy Manag. Proc., No. May, pp. 19-21.

M. Guacci, D. Bortis and J. W. Kolar, "On-state voltage measurement of fast switching power semiconductors," in CPSS Transactions on Power Electronics and Applications, vol. 3, No. 2, pp. 163-176, Jun. 2018.

C. Roy and B. Parkhideh, "Design Consideration for Characterization and Study of Dynamic on State Resistance of GaN Devices," 2019 IEEE 7th Workshop on Wide Bandgap Power Devices and Applications (WiPDA), 2019, pp. 181-186.

Cree Inc., "1.7kV, 8.0 mΩ All-Silicon Carbide Half-Bridge Module," CAS300M17BM2 datasheet, Jan. 2020.

* cited by examiner

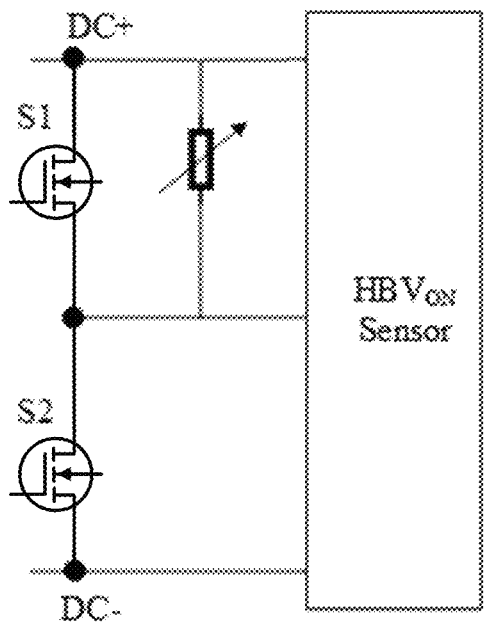
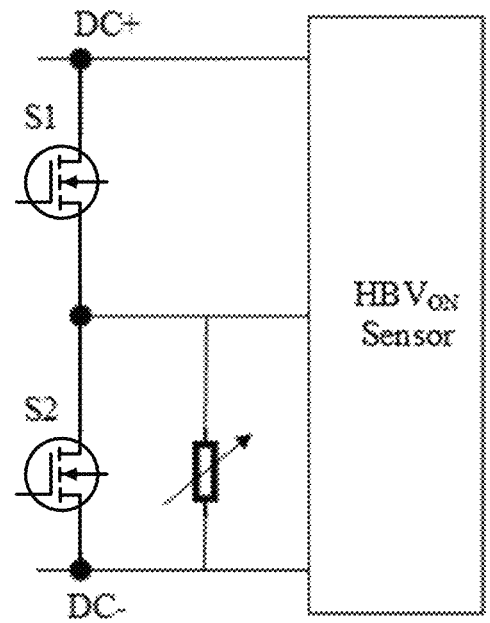
FIG. 13A  FIG. 13B
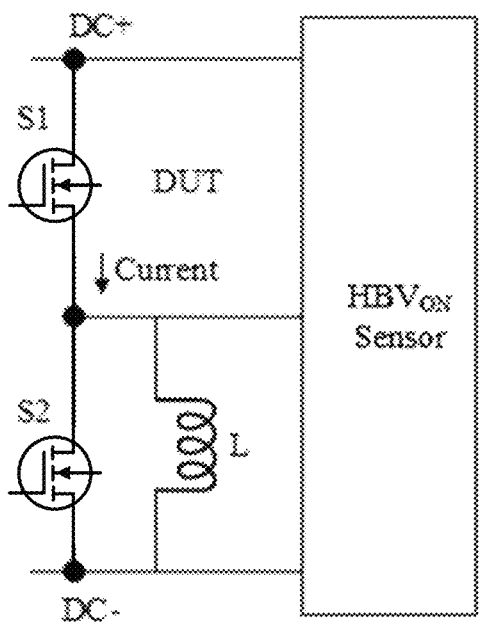
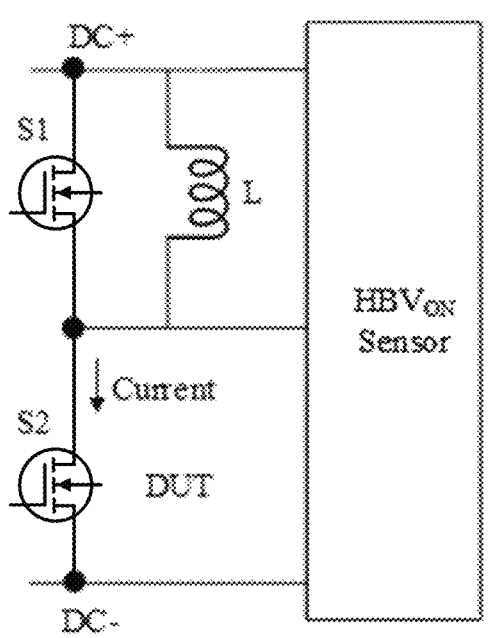
FIG. 14A  FIG. 14B

ON-STATE VOLTAGE MEASUREMENT OF HIGH-SIDE AND LOW-SIDE POWER TRANSISTORS IN A HALF-BRIDGE FOR IN-SITU PROGNOSTICS

CROSS REFERENCE TO RELATED APPLICATIONS

This application claims priority to, and the benefit of, U.S. provisional application entitled "On-State Voltage Measurement of High-Side Power Transistors in Three-Phase Four-Leg Inverter for In-Situ Prognostics" having Ser. No. 63/203,405, filed Jul. 21, 2021, which is hereby incorporated by reference in its entirety.

STATEMENT REGARDING FEDERALLY SPONSORED RESEARCH OR DEVELOPMENT

This invention was made with government support under DE-AC05-00OR22725 awarded by the Department of Energy (DOE). The government has certain rights in the invention.

BACKGROUND

Power electronics converters are being used in many areas of our modern electrical system. An estimated 20% of the total electric energy undergoes through power electronics converters from generation to end-users. However, power electronics converters are prone to failure. Among many different components in the power converters, 57.1% of the converter failures are attributable to the power semiconductors failures: 47.6% from primary side semiconductors and 9.5% from secondary side semiconductors. As semiconductor devices (e.g., MOSFETs and IGBTs) are the primary cause of converter failures, monitoring the health status of these devices can improve the overall reliability of the power converters.

Among different types of power semiconductor devices, the use of wide bandgap (WBG) semiconductor devices in power converters is expanding its application area because of their superior characteristics over Si-based transistors. WBG devices such as Gallium Nitride (GaN) high electron mobility transistors (HEMTs) and Silicon Carbide (SiC) metal oxide semiconductor field effect transistors (MOSFETs) are suitable for power converters operating under higher switching frequency, higher operating voltage, and higher operating temperature. Despite having these superior characteristics, researchers continue to report device degradation in different device layers such as solder joint crack, bond wire liftoff, chip metallization, etc. and reliability issues related to WBG devices in terms of increased on-state resistance ($R_{ON}$), threshold voltage instability, and gate-oxide reliability. Therefore, there is a need for monitoring these parameter to assess the health of the power semiconductor devices.

SUMMARY

Aspects of the present disclosure are related to on-state voltage sensing for in-situ monitoring and prognostics. Challenges of implementing in-situ prognostics to practical power converters can be addressed by a new on-state voltage ($V_{ON}$) monitoring circuit for the high-side power transistors. One aspect references the drain of the high-side transistors for their $V_{ON}$ measurement. This circuit allows $V_{ON}$ measurement of not only multiple high-side transistors but also multiple low-side transistors at the same time. The measured $V_{ON}$ can used to determine on-state resistance ($R_{ON}$) in real-time using the drain-current measured using an off-the-shelf current sensor. The on-state voltage monitoring circuit is used in a 75 kW 1000 VDC three-phase DC-AC inverter for in-situ prognostics. Validations of the proposed $V_{ON}$ measurement circuit and $R_{ON}$ monitoring are presented using theoretical circuit analysis and experimental results. The measured $R_{ON}$ is within the datasheet specified range.

In another aspect, a half-bridge (HB) on-state voltage ($V_{ON}$) sensor is capable of being utilized for in-situ measurements enabling continuous and real-time monitoring of the on-state resistance. The design can provide a single $V_{ON}$ measurement output that contains independent $V_{ON}$ information of both high-side and low-side devices in a HB leg. The measurement output can be referenced from the middle point of the HB and combines the two complementary $V_{ON}$ sensing outputs. This system can reduce the number of components, analog signal processing circuits, and ADC channels for in-situ health monitoring of a power electronics system. These reductions can facilitate integration of the $V_{ON}$ sensor with the gate driver board and achieve low system profile. The experimental results demonstrate the proposed $V_{ON}$ measurements while switching with inductive and resistive loads.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 13A and 13B illustrate test method for derivation of sensor characteristics for the HB on-state voltage sensor, in accordance with various embodiments of the present disclosure.

FIGS. 14A and 14B illustrate circuit configurations for DPT tests of the HB on-state voltage sensor, in accordance with various embodiments of the present disclosure.

DETAILED DESCRIPTION

Figure 1:
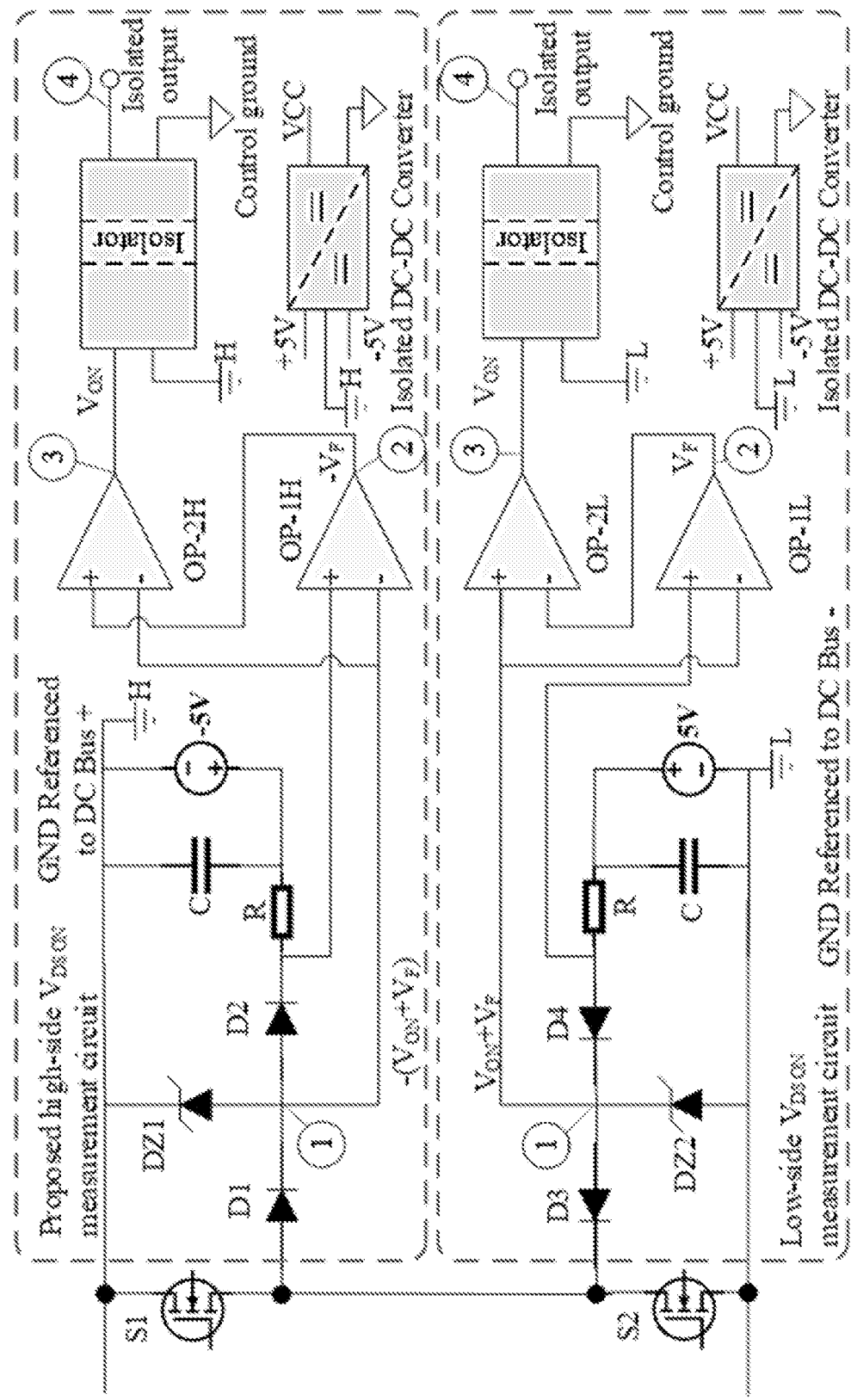
FIG. 1 illustrates an example of an on-state monitoring circuit for high-side and low side $V_{DSON}$ measurement, in accordance with various embodiments of the present disclosure.

Disclosed herein are various examples of apparatus, systems and methods related to on-state voltage sensing for in-situ monitoring and prognostics. Reference will now be made in detail to the description of the embodiments as illustrated in the drawings, wherein like reference numbers indicate like parts throughout the several views.

Wide bandgap (WBG) semiconductor devices could be deployed in a wide range of practical applications if the device's health status could be monitored in real-time to prevent a sudden failure. The device ages through different degradation mechanisms caused by various electro-mechanical stresses in long-term operations. Many degradation mechanisms such as gate-oxide degradation and bond wire degradation lead to increased $R_{DSON}$. Therefore, $R_{DSON}$ is a good indicator of device health status, which can be used for in-situ prognostics.

Implementation of in-situ monitoring of $R_{DSON}$ of power transistors has been attempted on a low-side device either in a double pulse test (DPT) setup or in a converter where the low-side device acts as an active switch such as a DC-DC boost converter or a PFC converter. A complete system-level condition monitoring of a three-phase inverter having three half-bridge (HB) legs has been considered. Although the proposed condition monitoring method uses much fewer components and is easy to be implemented in an inverter system, it is an indirect method that extracts the health monitoring indicators of the IGBT modules from the inverter output voltage measurement circuit. The extracted measurement output contains combined health information of two devices, where independent health monitoring of individual transistors is not achievable. Independent and simultaneous on-state voltage ($V_{DSON}$) measurement of individual transistors is more effective as a failure of a single transistor may lead to the failure of the entire system.

This disclosure considers a solution to implement $R_{DSON}$ monitoring of all power transistors used in a power electronics converter having single or multiple HB legs, such as a three-phase four-leg DC-AC inverter. In this process, measuring the high-side $R_{DSON}$ was found to be the most challenging part. A new $V_{DSON}$ measurement circuit is proposed to address this challenge. A complete in-situ $R_{DSON}$ monitoring architecture was implemented in an inverter using the proposed circuit along with signal isolation and complementary circuitry. The feasibility and the effectiveness of the proposed $V_{DSON}$ measurement circuit were verified through experimental results of SiC MOSFETs modules' double pulse tests.

Challenges of In-Situ Prognostics

A power electronics converter can be controlled by a control system comprising processing circuitry such as a digital microcontroller or an FPGA. A control system not only sends pulse-width modulation signals to the gate drive circuits but also receives many different measurement signals for various functions such as closed-loop control algorithms, status monitoring, system protection, etc. These measurements can be referenced to a control reference (e.g., a control ground) to be applied to and processed in the control system. In the in-situ prognostics applications, the $V_{DSON}$ and drain-current ($I_D$) of a power transistor referenced to the control ground can be sent to the control system to calculate the $R_{DSON}$. In a three-phase DC-AC inverter having multiple HB legs (e.g., 3 or 4), however, all $V_{DSON}$ measurements of individual power transistors do not have a common $V_{DSON}$ measurement reference. Therefore, measured $V_{DSON}$ of different MOSFETs cannot be tied to the control reference directly. This issue leads to challenges of implementing the in-situ prognostics to practical power electronics converters.

$V_{DSON}$ of individual transistors can be measured using conventional approaches. The challenge is to translate these measurements to the control system with respect to the control ground. In a half-bridge circuit for example, the $V_{DSON}$ measurement of the high side and low-side devices cannot share a common reference signal. In a multi-phase inverter, the lack of a common reference signal for the transistors increases the complexity of $V_{DSON}$ measurement. On-state voltage measurement using existing sensors utilizes three different measurement references for the high-side devices, which needs three isolated power supplies for three high side sensors and one for the low side sensors. Because of the complexity associated with the measurement and the reference, many works that have reported direct $R_{DSON}$ measurement have been mainly done on the $V_{DSON}$ measurement of the low-side devices. In a multi-phase half-bridge inverter, the low-side devices share a common reference. In many designs, this reference can be tied to the control reference.

An in-situ monitoring approach obtaining $V_{DSON}$ information of both high-side and low-side devices in a three-phase three-leg inverter has been considered, where the sensing circuit is connected between two AC output phases and measures the sum of the $V_{DSON}$ of one transistor and the forward voltage drop of one diode. This approach can potentially monitor multiple transistors in a three-phase system with a single reference of measurement. Nevertheless, the reference of the measurement can be one phase from the three. This method may be limited in application and accuracy, as the power circuit terminals and the control ground can be separated or isolated. Therefore, an advanced $V_{DSON}$ measurement system can be used, where any number of transistors can be monitored independently and simultaneously without the need to be connected to a certain reference point and instead directly connected to the control reference.

Proposed In-Situ Prognostics

Figure 2:
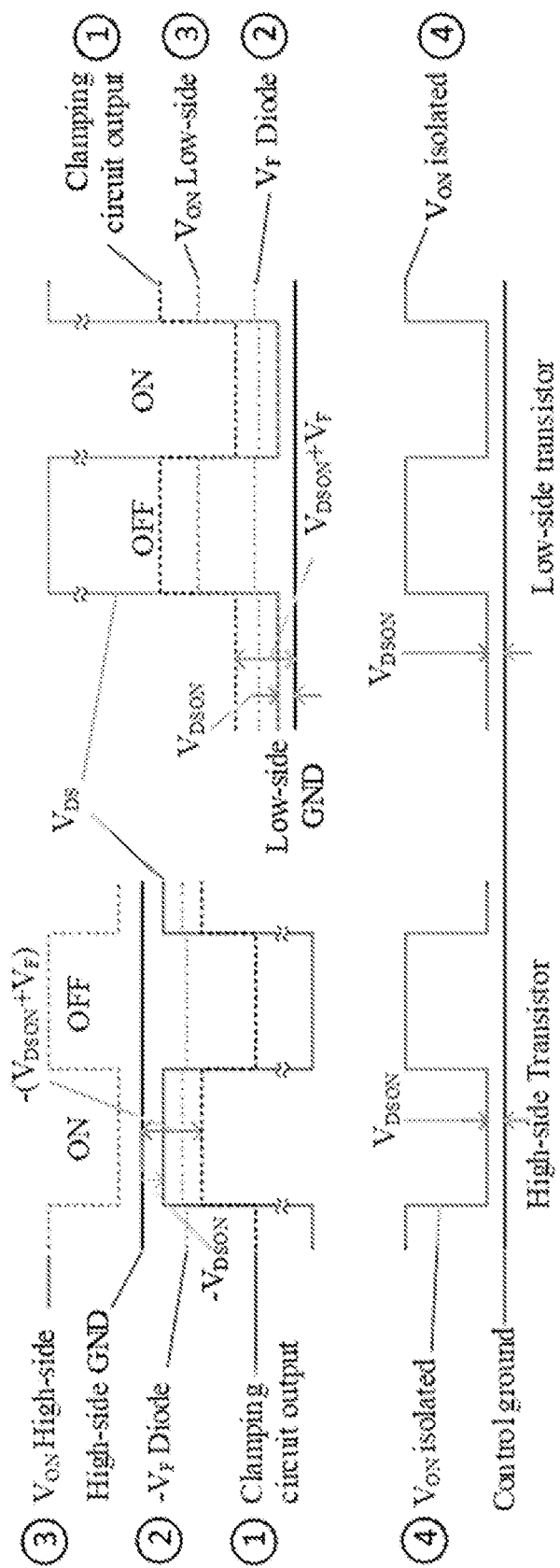
FIG. 2 illustrates examples of waveforms at different nodes of the monitoring circuit of FIG. 1, in accordance with various embodiments of the present disclosure.

Proposed $V_{DSON}$ Measurement Method. A circuit capable of enabling $V_{DSON}$ measurement of the high-side devices has been developed. The proposed circuit measures the $V_{DSON}$ of the high-side transistors in reference to the drain (DC Bus +), as opposed to referenced to the source terminal that is used in conventional $V_{DSON}$ measurement circuits. The high-side sensors use the same reference (DC+) for all the three high side devices, which needs only one isolated power supply for the high-side sensors and another for the the low side sensors. An example of the proposed circuit for high-side and low side $V_{DSON}$ measurement is illustrated in FIG. 1. Different nodes at the circuit are marked as node 1, 2, 3, and 4. Node 1 is the clamped point voltage measurement node. Node 2 is the diode forward voltage measurement point. Node 3 is the on-state voltage (non-isolated) and node 4 is the on-state voltage referenced to the control ground (isolated). The ideal waveforms at the different nodes of the $V_{DSON}$ monitoring circuit are presented in FIG. 2, with the high-side measurements on the left and the low-side measurements on the right.

The $V_{DSON}$ measurement circuit comprises three stages. The first stage is a clamping stage, which clamps the high voltage when the transistor is off and passes only the low $V_{DSON}$ when the transistor is on. A high voltage Schottky diode (D1) is connected to the source of the high-side transistor, which only allows current flow from the source to the $V_{DSON}$ measurement circuit. The $V_{DSON}$ measurement circuit references the drain of the high-side transistor. The clamped point indicated as node 1, where the cathode of the blocking diode (D1) is connected, has a voltage potential within a setpoint set by the Zener diode (DZ1) (e.g., 3V in the circuits used in this disclosure) below the drain potential. When the transistor is turned off, the transistor has much higher potential in its drain terminal compared to the source. Therefore, the blocking diode (D1) becomes reverse biased and disconnects the source terminal from the measurement circuit. When the transistor is turned on, the transistor has a very small potential difference between the drain and the source terminals. This potential difference makes the blocking diode (D1) forward biased, completing the circuit through the transistor. Node 1 now measures the inverted sum of $V_{DSON}$ and the forward voltage drop ($V_F$) of the Schottky diode (D1). The voltage at node 1 is presented in Table I below.

Actual $V_{DSON}$ can be calculated by subtracting the diode forward voltage drop ($V_F$) from the absolute value of the voltage at node 1. However, the forward voltage drop of the Schottky diode is dependent on the current through it and the junction temperature. It is possible to estimate the forward voltage drop across the Schottky diode if the temperature is known, however, accurate and reliable junction temperature estimation is problematic. To overcome this issue, another Schottky diode (D2), same with the blocking diode (D1), is placed in series very close to the blocking diode (D1) so that they operate at a similar temperature level. When the transistor is on, the same current flows through these two diodes (D1 & D2), ensuring the same forward voltage drop across each of these two diodes. The voltage drop across the second diode (D2) is measured using a differential amplifier circuit which is a part of the second stage of the $V_{DSON}$ measurement circuit. The output of this circuit is measured at node 2. The voltage at node 1 is then subtracted from the voltage at node 2 to get the $V_{DSON}$ of the DUT, which is indicated at node 3. Node 4 is the output of the last stage that translates the measured $V_{DSON}$ from the measurement circuit reference (DC Bus +) to the control circuit reference.

The low-side $V_{DSON}$ measurement circuit works in a similar way, except it references the negative DC bus (DC Bus −). The voltages at different measurement nodes are described in Table I.

TABLE I

Measurements at Different Nodes

| Node | High-side | Low-side | MOSFET Status |
|---|---|---|---|
| 1 | $-(V_{DSON} + V_F)$ | $V_{DSON} + V_F$ | ON |
|  | −3 V | 3 V | OFF |
| 2 | $-V_F$ | $V_F$ | X |
| 3 | $V_{DSON} = V_{NODE2} - V_{NODE1}$ | $V_{DSON} = V_{NODE1} - V_{NODE2}$ | ON |
|  | $3 - V_F = V_{NODE2} - V_{NODE1}$ | $3 - V_F = V_{NODE2} - V_{NODE1}$ | OFF |

Figure 3:
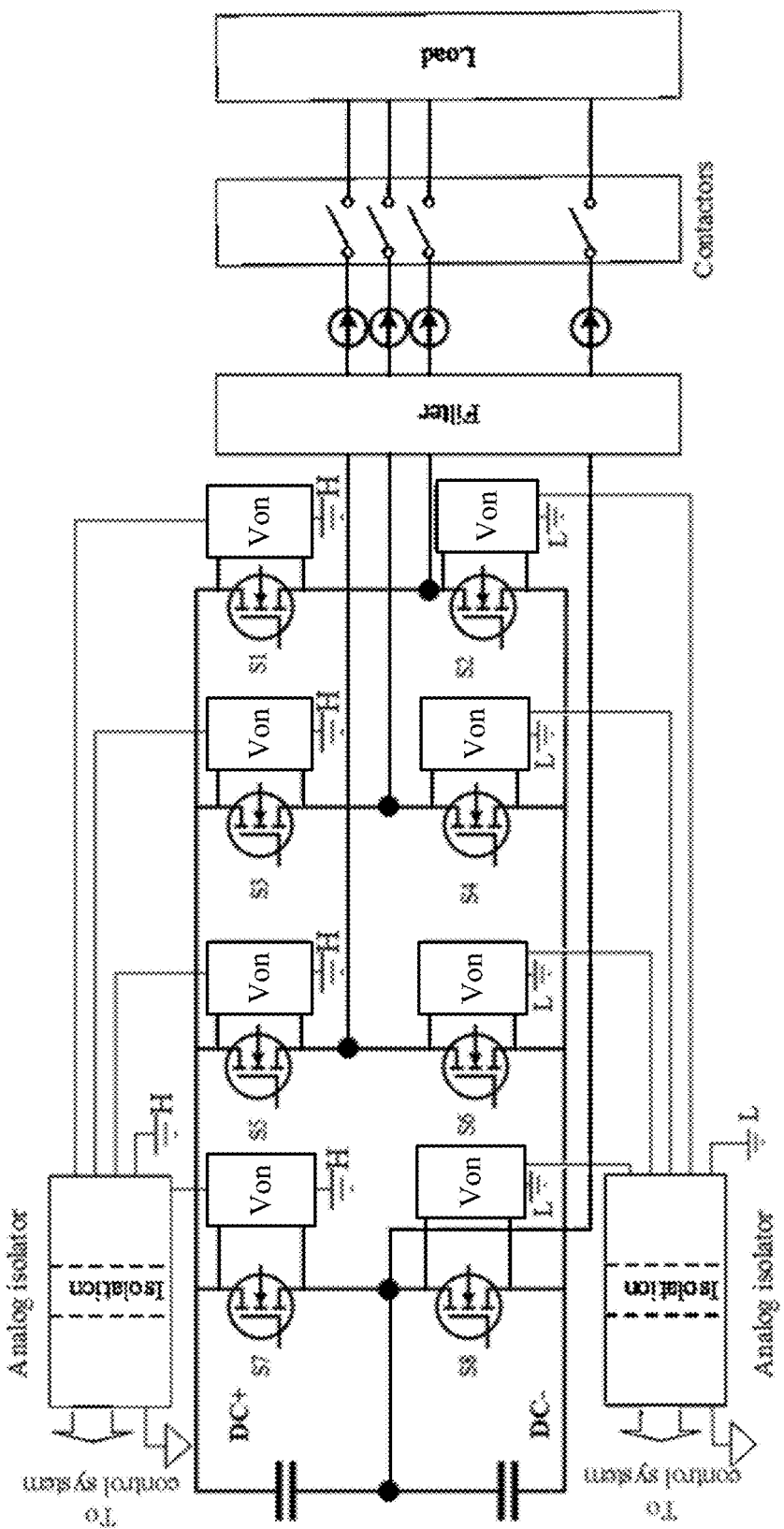
FIG. 3 illustrates an example of in-situ monitoring in a three-phase, four-leg inverter, in accordance with various embodiments of the present disclosure.
Figure 4:
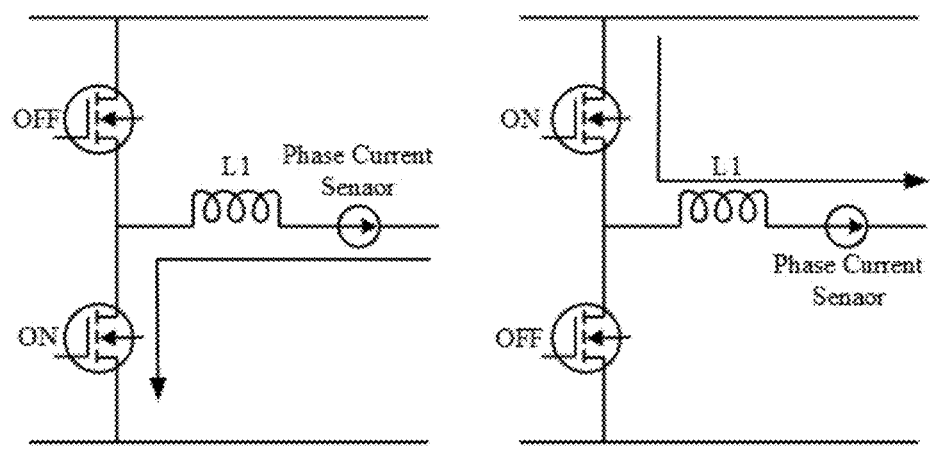
FIG. 4 illustrates current flow path through a phase current sensor and one of the two MOSFETS in a HB leg, in accordance with various embodiments of the present disclosure.

Proposed $R_{DSON}$ Monitoring for In-situ Prognostics. The proposed approach of in-situ $R_{DSON}$ monitoring is presented in FIG. 3, which shows an example of a three-phase four-leg inverter with the in-situ monitoring. In this approach, individual $V_{DSON}$ measurement circuits can be used for the corresponding transistors, where the current sensors are placed in the phase lines. The inductor current is the same as the transistor current when the transistor is on. Therefore, one current sensor can provide the switch current information of two transistors depending on the status of the transistors considering complementary switching. FIG. 4 is a schematic diagram illustrating the current flow path through the phase current sensor and one of the two MOSFETS in one HB leg. As shown in FIG. 4, the current sensor placement in the system allows the current sensor to measure the current through the MOSFET that is on.

Hardware Setup and Experiment Results

Figure 5A:
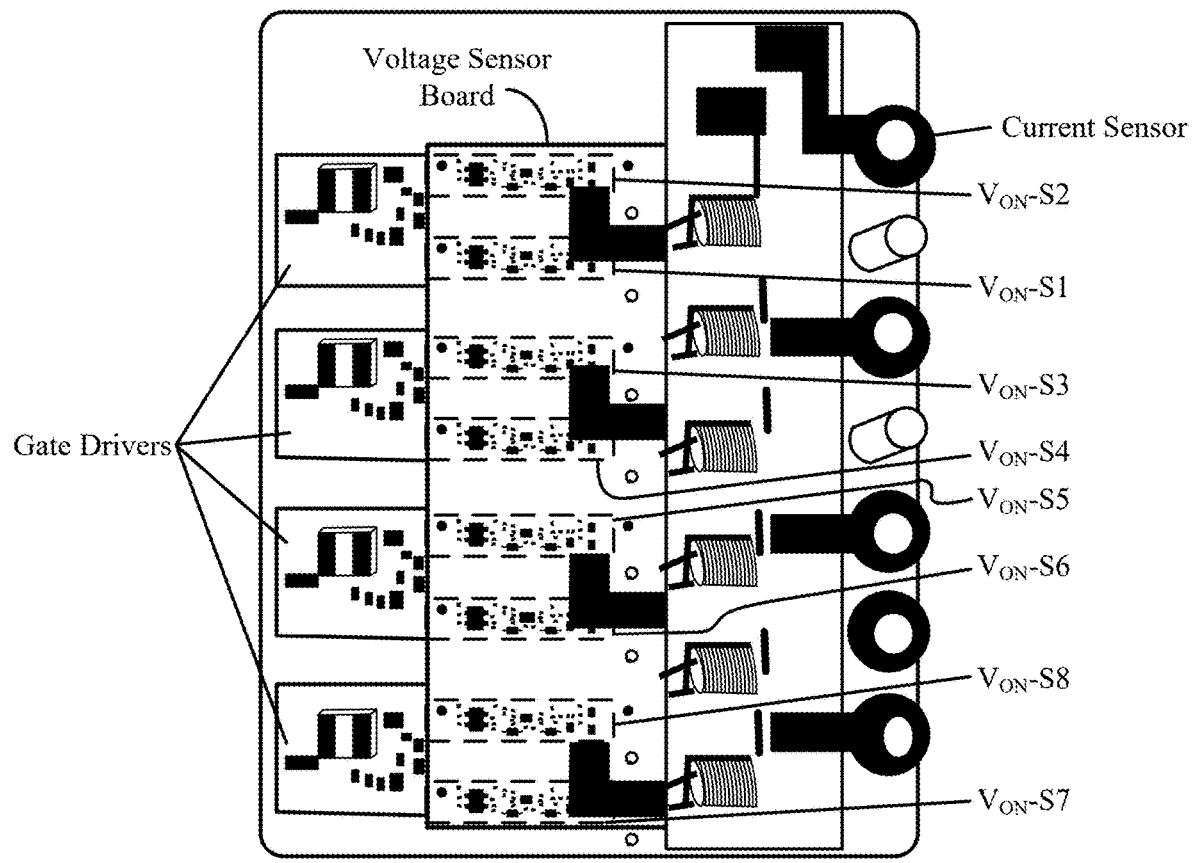
FIGS. 5A and 5B are images showing an example of an on-state voltage sensor board, in accordance with various embodiments of the present disclosure.
Figure 5B:
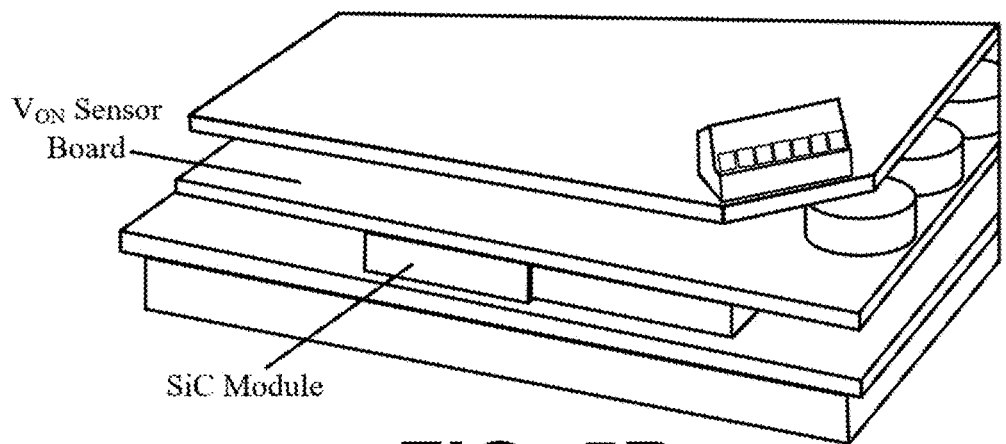

The proposed in-situ $R_{DSON}$ monitoring was implemented in a three-phase four-leg inverter. The specification of the inverter is presented in Table II. Different components of the inverter are arranged vertically for a compact design. FIGS. 5A and 5B are images illustrating the $V_{ON}$ sensor board mounted on top of the four SiC MOSFET HB modules, phase inductors, gate drivers and current sensors. FIG. 5A is a top view and FIG. 5B is an isometric view. The current sensors were placed in series with the filter inductors at the output of the four SiC modules.

TABLE II

Specification of the Three-Phase Four-Leg DC-AC Inverter

| Parameter | Value | Unit |
|---|---|---|
| Power | 75 | kW |
| Input Voltage | 1000 | VDC |
| Output Voltage | 480 | VAC |
| Topology | 3-Ø, 4-leg | |
| Switching Frequency | 30 | kHz |
| No of Half-bridge modules | 4 | |
| SiC Module | CAS300M17BM2 | |

Figure 6A:
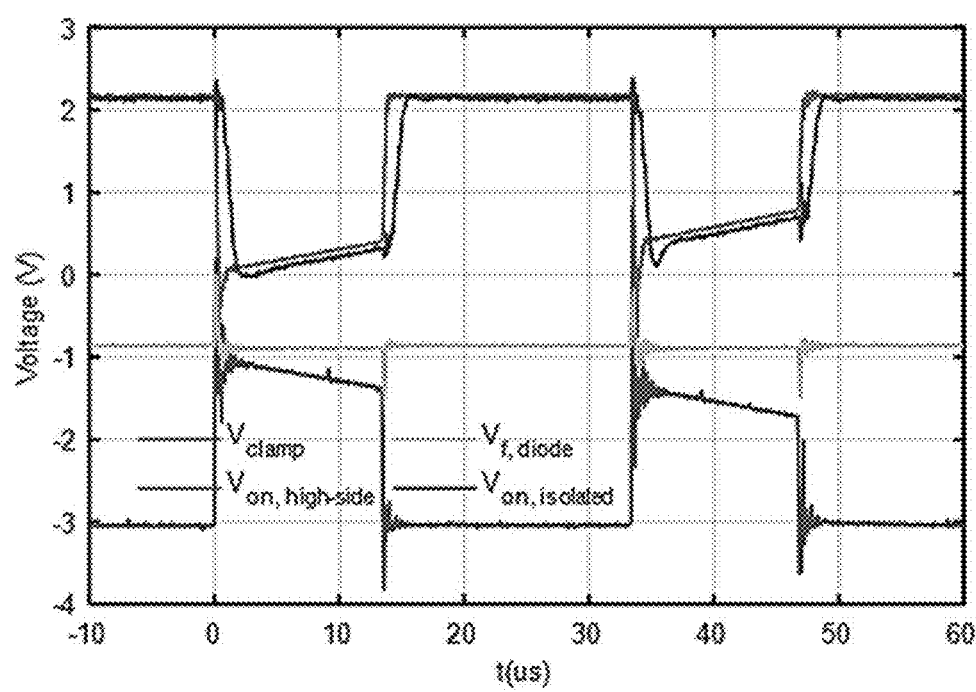
FIGS. 6A and 6B illustrate examples of voltages measured at various nodes in of the monitoring circuit of FIG. 1, in accordance with various embodiments of the present disclosure.
Figure 6B:
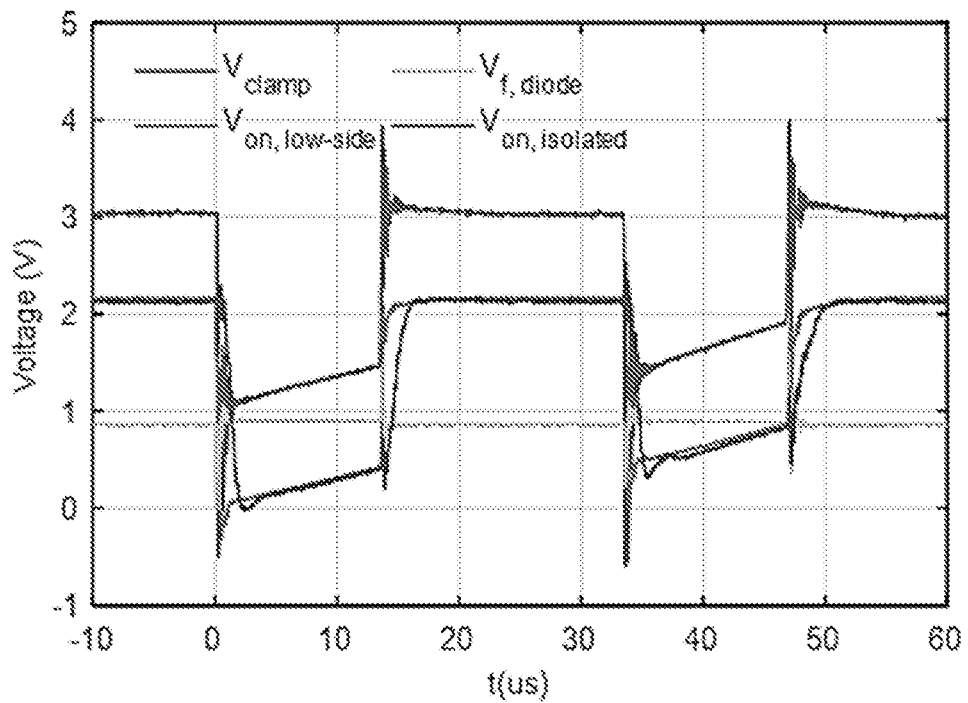

The accuracy of the proposed circuits was verified by monitoring signals at different nodes and comparing the measurements with theoretical calculations. As presented in FIGS. 1 and 2, the output of the clamped stage was monitored at node 1, the diode forward voltage was measured at node 2, the non-isolated $V_{DSON}$ was measured at node 3, and the isolated $V_{DSON}$ was measured at node 4. Measurements at these different nodes are presented in FIGS. 6A and 6B for both the high-side and low-side MOSFETs. FIG. 6A is an example of the experimental results on different nodes for the high-side measurements and FIG. 6B is an example of the experimental results on different nodes for the low-side measurements. Signals are measured at the different nodes to verify the accuracy of the high-side and low-side $V_{DSON}$ measurement. These measurements match the ideal waveform and theoretical calculation. It has been found that the analog conditioning circuit and the analog isolator add some time delay in the measured signal. This delay can be determined from the experiment results and adjusted later for the final $R_{DSON}$ calculation to synchronize the $V_{DSON}$ measurements with the current measurements.

Figure 7A:
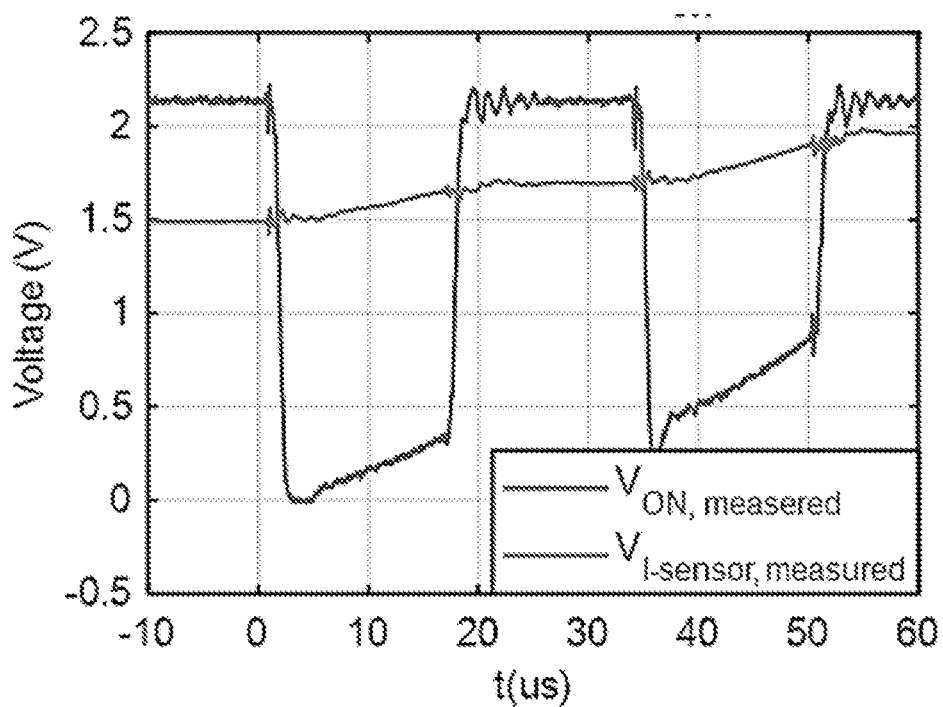
FIGS. 7A-7D illustrate examples of experiment results, in accordance with various embodiments of the present disclosure.
Figure 7B:
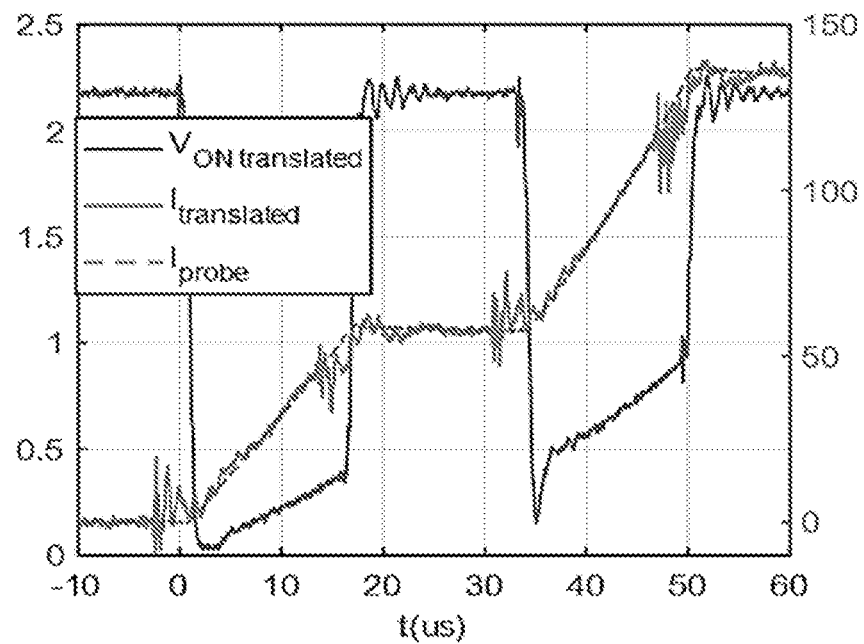
Figure 7C:
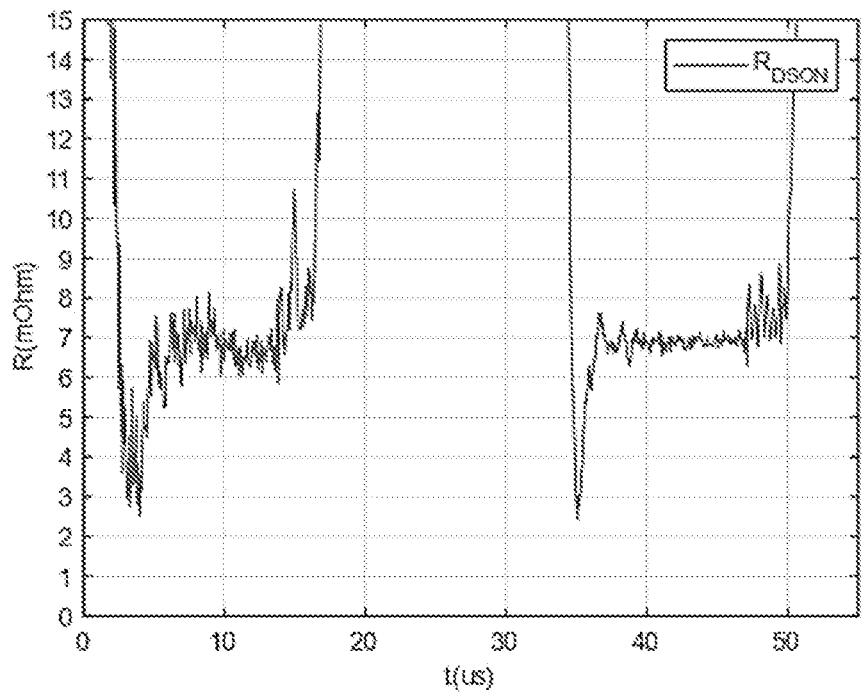
Figure 7D:
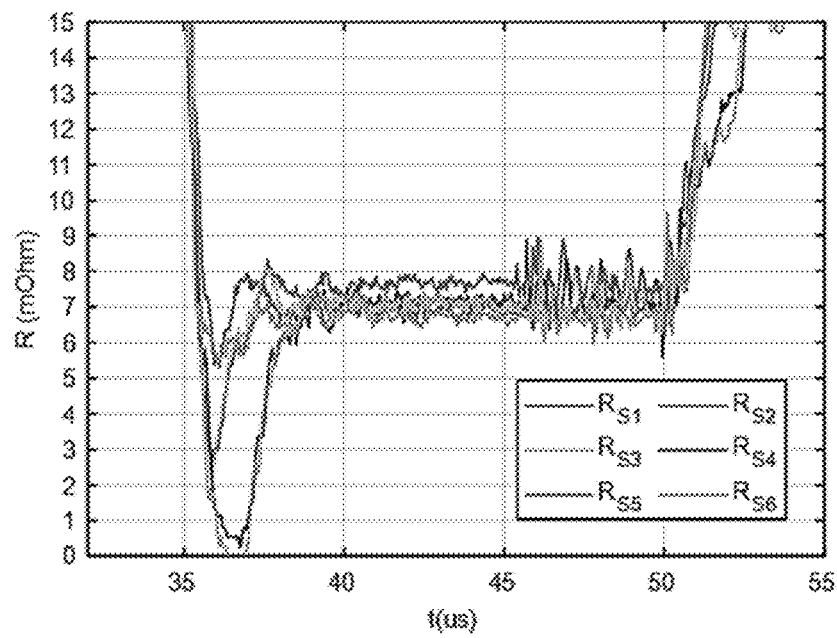

For $R_{DSON}$ monitoring, the device drain current $I_D$ is needed along with the $V_{DSON}$ measurement. Commercial hall effect current sensors have been used for the phase current measurement, as presented in FIG. 3. These current sensors and their analog signal processing circuits also add time delay to the final measurement output. The current measurement time delay has been compensated by comparison with a commercial current probe (TCP0150) to synchronize the current measurements with the $V_{DSON}$ measurements for the $R_{DSON}$ calculation. Multiple double pulse tests were conducted to record the $V_{DSON}$ and $I_D$ for all six MOSFETs in the three phases. FIGS. 7A-7D illustrate examples of experiment results for $R_{DSON}$ measurement, with FIGS. 7A-7C presenting data for the high-side MOSFET of module-1 and FIG. 7D presenting the measured $R_{DSON}$ for all six MOSFETs in the three phases. The fourth leg, which is the neutral leg of the inverter, was not monitored for this evaluation. The experiment was conducted at 1000V input voltage and 140 A maximum drain current.

Recorded current and voltage waveforms for the high-side MOSFET of module-1 (S1) are presented in FIG. 7A. FIG. 7B presents the translated data, which has been adjusted for the propagation delay, gain, and offset of the conditioning circuit. FIG. 7C presents the $R_{DSON}$ calculated using the translated voltage and current data. FIG. 7D presents the $R_{DSON}$ during the second pulse for all six MOSFETs in the three phases of the inverter. The test was conducted at room temperature. As the inverter is only operated for two pulses, the module temperature was recorded to be the same as the room temperature, which was 25° C. The $R_{DSON}$ value of the six MOSFETs at 100 A current is presented in Table III and compared with the typical $R_{DSON}$ presented in the datasheet.

TABLE III

Measured RDSON

| MOSFET | $R_{DSON}$ Measured (mΩ) | Typical $R_{DSON}$ listed on Datasheet | Deviation from the typical $R_{DSON}$ mΩ | % |
|---|---|---|---|---|
| S1 | 6.88 | 7.3 mΩ | 0.42 | 5.8 |
| S2 | 7.69 | (100 A, 25° C.) | −0.39 | −5.3 |
| S3 | 7.09 | | 0.21 | 2.9 |
| S4 | 7.27 | | 0.03 | 0.4 |
| S5 | 6.81 | | 0.49 | 6.7 |
| S6 | 7.14 | | 0.16 | 2.2 |

The datasheet indicates that the SiC MOSFET has a typical resistance of 8 mΩ and a maximum 10 mΩ $R_{DSON}$ under 300 A, 25° C. operating condition. The typical and maximum values suggest that the $R_{DSON}$ may vary as much as 25% from the typical value. The typical $R_{DSON}$ is estimated to be 7.3 mΩ under 100 A and 25° C., from the graphs in the datasheet. Therefore, based on the deviation range provided for 300 A current, the maximum $R_{DSON}$ can be 9.125 mΩ under 100 A current and 25° C. temperature. The deviation of the measured $R_{DSON}$ from typical datasheet value is less than 0.5 mΩ (6.7%). While the exact accuracy of the measurement cannot be calculate based on the typical value, the accuracy is within the range specified for the released part.

The challenges of in-situ prognostics have been investigated, and a new on-state voltage measurement circuit, which can measure the $V_{DSON}$ of the high-side power transistors by referencing the positive DC bus and provide an absolute measurement of the $V_{DSON}$, has been presented. Measured $V_{DSON}$ can then be translated into the controller side reference using an analog isolator. The proposed high-side $V_{DSON}$ measurement circuit enables a single reference point for all high-side transistors, which reduces component count and simplifies the implementation. This new $V_{DSON}$ measurement circuit along with low-side $V_{DSON}$ measurement circuit can be used in, e.g., a three-phase four-leg inverter for real-time in-situ $R_{DSON}$ monitoring for prognostics and lifetime prediction. The proposed circuit was validated using experimental results. The proposed method can facilitate simultaneous measurement of all the MOSFETs in the inverter. $R_{DSON}$ was recorded for all the MOSFETs in three phases in multiple double pulse tests and the deviation of the measured $R_{DSON}$ from the typical value specified in the datasheet was found to be less than 6.7% (0.5 mΩ). Therefore, the accuracy is within the datasheet specified range: 25% from the typical value, which can make the methodology more than accurate enough for use in real world applications.

Half-Bridge On-State Voltage Sensing

Figure 8A:
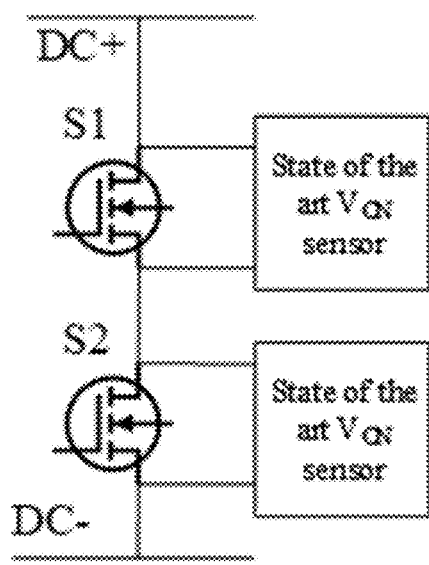
FIGS. 8A and 8B illustrate examples of sensing circuits for on-state voltage measurement, in accordance with various embodiments of the present disclosure.
Figure 8B:
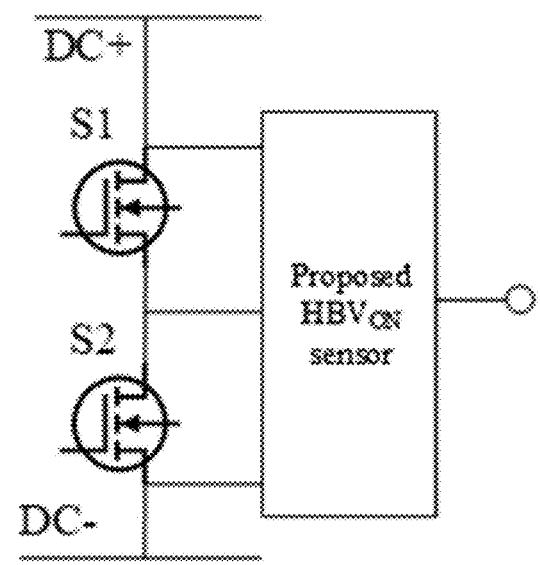

Device degradation mechanisms can lead to increase of on-state voltage ($V_{ON}$) at a certain current. Real-time monitoring of the device degradation can predict possible device failure enabling users to act to prevent system interruption, thus increasing system reliability. At present, state-of-the-art $V_{ON}$ sensors measure the $V_{ON}$ of a single transistor, and each sensing circuit has a measurement output signal per transistor as illustrated in FIG. 8A. As most power electronics systems such as 1-Ø or 3-Ø inverters use one or multiple half-bridge (HB) legs, having one signal output per each HB leg, as shown in FIG. 8B, simplifies the system integration requirements in terms of signal conditioning, electrical, and mechanical integration.

Figure 9:
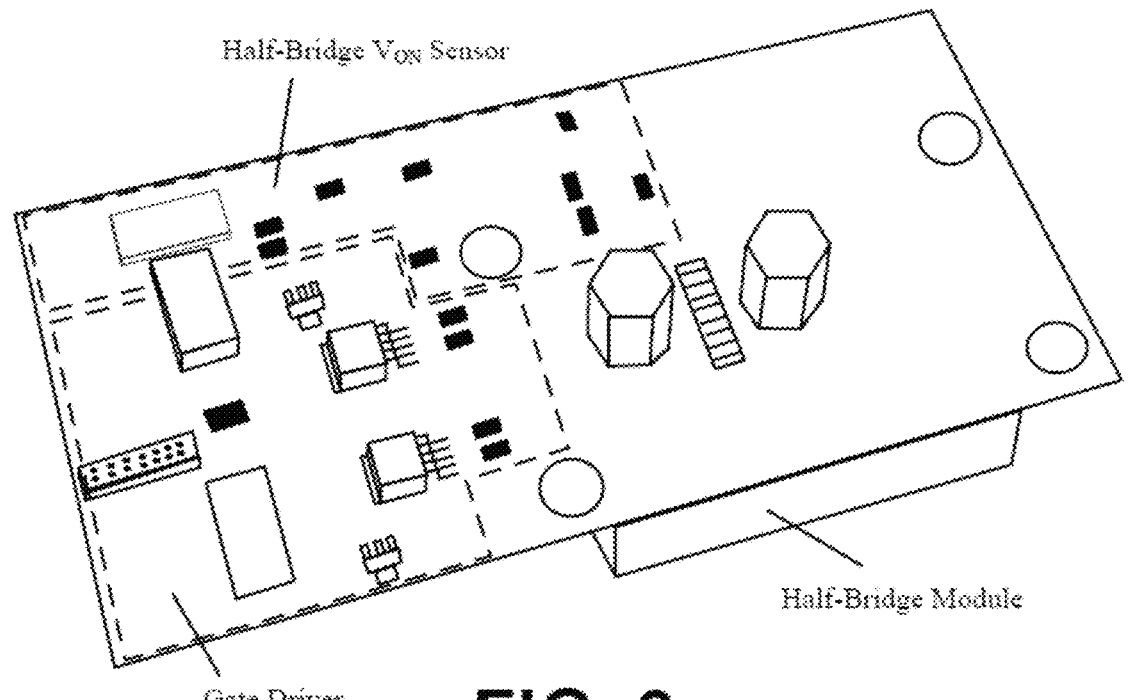
FIG. 9 is an image of an example of a HB on-state voltage sensor, in accordance with various embodiments of the present disclosure.

The current disclosure presents a $V_{ON}$ sensor capable of measuring the $V_{ON}$ of both the high-side and low-side devices in a single measurement signal. FIG. 9 is an image of a fabricated half-bridge (HB) $V_{ON}$ sensor with gate driver for a HB. The reduced number of measurement signals can result in a reduction of signal processing requirements including analog signal conditioning and analog-to-digital conversion used for in-situ monitoring. Therefore, the proposed sensor offers a seamless implementation of in-situ $R_{ON}$ monitoring in the existing power electronics control system. On-state current information can be obtained using existing inductor current sensor in a HB leg and can be used to achieve Rory measurements of two power transistors in a HB leg. The electrical circuit of the proposed sensor is presented with detailed analysis and experimental results.

Proposed Half-Bridge $V_{ON}$ Sensor

Figure 10:
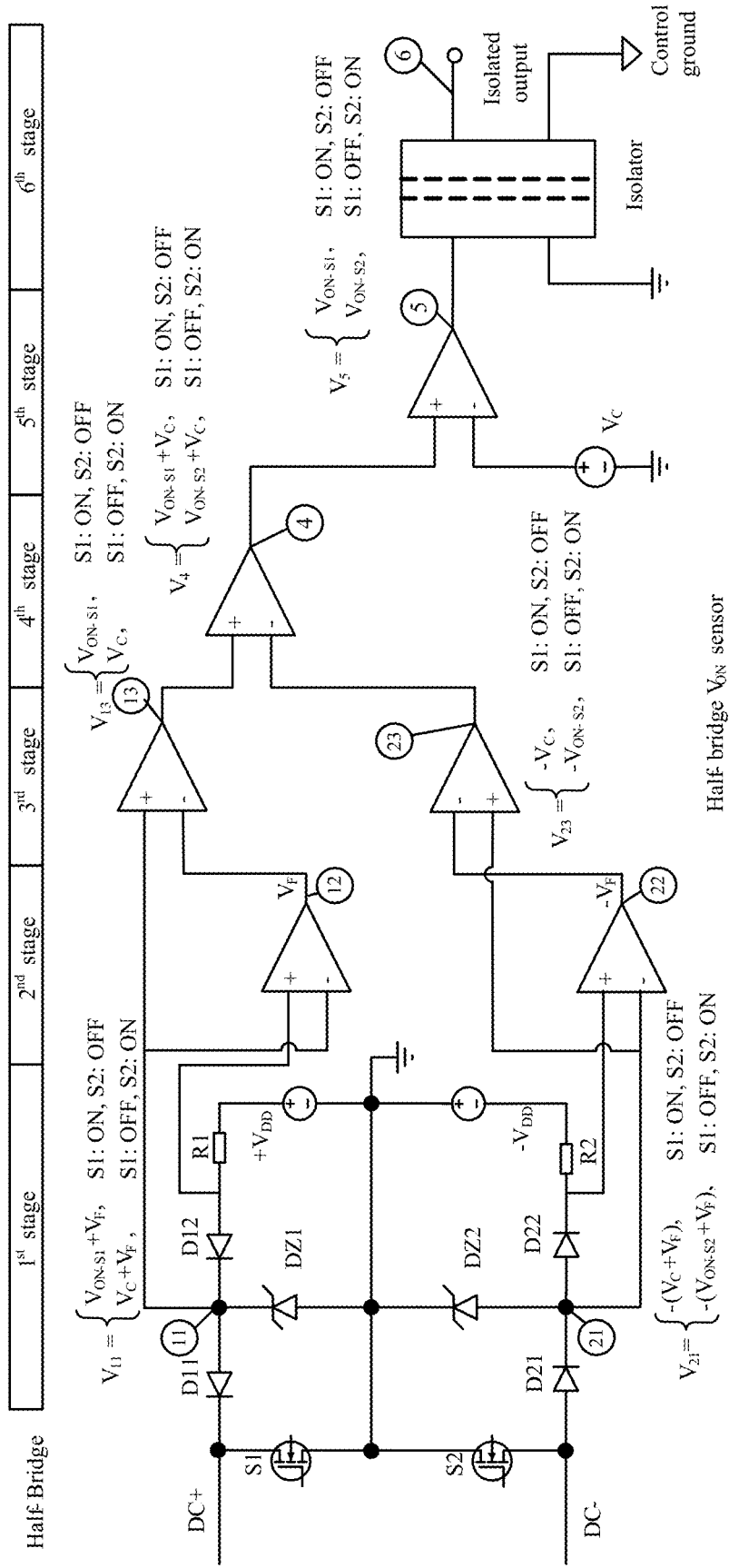
FIG. 10 illustrates an example of a HB on-state voltage sensor schematics, in accordance with various embodiments of the present disclosure.

In most applications, the high-side and low-side devices in a HB are turned ON and OFF in a complimentary manner. When the high-side device is turned ON, the low-side device is turned OFF and vice versa to prevent shoot-through. The proposed HB $V_{ON}$ sensor (HBV$_{ON}$) sensor measures the $V_{ON}$ of both the high-side and low-side devices independently and then combines them to a single sensor output. FIG. 10 presents the circuit diagram of the proposed HBV$_{ON}$ sensor connected to the three terminals of an HB leg consisting of two MOSFETs. The HBV$_{ON}$ sensor comprises two independent sensing circuits for the low-side and high-side devices. The fundamental operating principle of the individual sensing circuits are presented above. The HBV$_{ON}$ sensor comprises four circuit stages. The novelty of the HBV$_{ON}$ sensor includes the combination of the high-side and low-side circuits by swapping their orientation. As shown in FIG. 1, the high-side $V_{ON}$ sensor references DC+ and the low-side $V_{ON}$ sensor references DC−. But in the HBV$_{ON}$ of FIG. 10 both the high-side and low-side $V_{ON}$ sensors reference the middle point of a half-bridge and eventually the outputs of two $V_{ON}$ sensors are combined to have one single sensor output. As illustrated in the example of FIG. 10, the HBV$_{ON}$ sensor includes six signal processing stages.

Figure 11A:
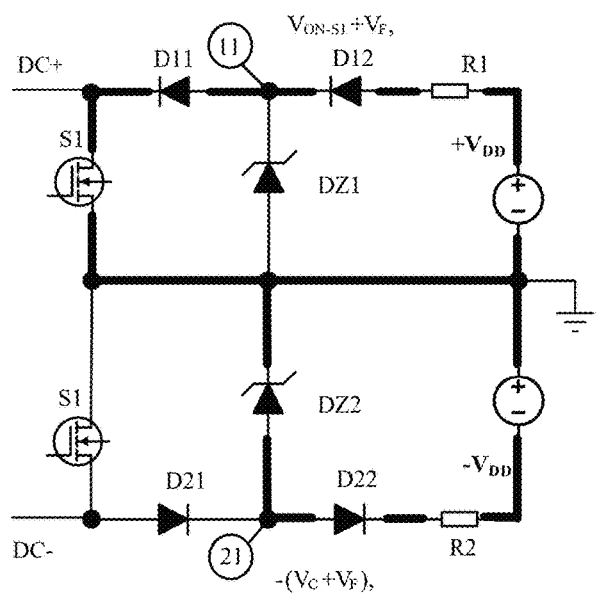
FIGS. 11A and 11B illustrate operation of voltage clamping circuits of the HB on-state voltage sensor, in accordance with various embodiments of the present disclosure.
Figure 11B:
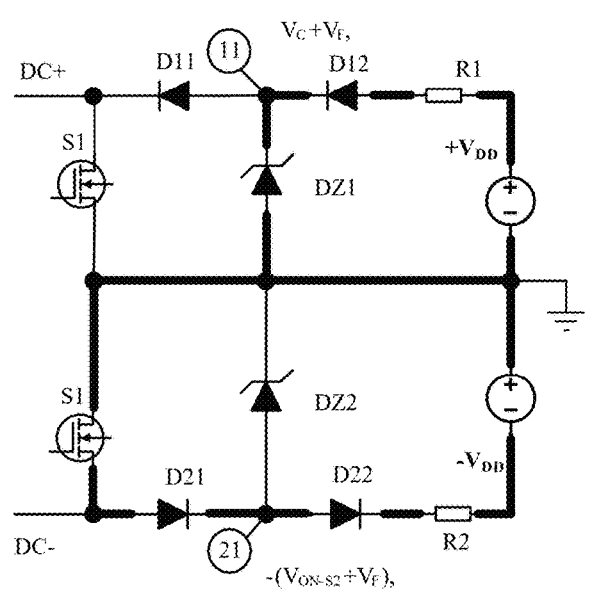

The first stage is the clamping circuit that clamps the high voltages from the transistor nodes when the transistors are in off-state. The components (except the blocking diodes) used in the sensor have a lower voltage rating (under 25V) while the HB operates in hundreds of volts. The blocking diodes block the high-voltage and clamp the sensing circuit voltages within a set voltage to prevent damage to the circuit. The operating principle of the combined voltage clamping circuits of the HB $V_{ON}$ sensor is highlighted in FIGS. 11A and 11B. When the high-side device S1 is in the ON state (as shown in FIG. 11A), the potential of the middle point (reference of the sensor) is very close to DC+, which makes the diode D11 forward biased. Device S2 being in the OFF state, sees the full DC bus voltage across its terminals, which makes diode D21 reversed biased. Similarly, when the high-side device S1 is in the OFF state and the low-side device S2 is in the ON state (as shown in FIG. 11B), diode D11 becomes reversed biased and diode D21 becomes forward biased. Thus, although the sensor is connected to the HB and across the DC bus, the high voltage is blocked either by diode D11 or by diode D21.

FIG. 11A illustrates the HB and HBV$_{ON}$ sensor interaction when the high-side device S1 is in the on-state and the low-side device S2 is in the off-state. At this condition, the node voltage at node 11 (high-side clamped point) measures $V_{ON\text{-}S1}+V_F$, where $V_{ON+S1}$ is the on-state voltage of the high-side device (S1) and $V_F$ is the forward voltage drop of the diode D11. As the low-side device (S2) is off during this period, the node voltage at node 21 measures a constant voltage $-(V_C+V_F)$.

FIG. 11B illustrates the HB and HBV$_{ON}$ sensor interaction when the low-side device is in the on-state and the high-side device is in the off-state. At this condition, the node voltage at node 21 (low-side clamped point) measures $-(V_{ON\text{-}S2}+V_F)$, where $V_{ON\text{-}S2}$ is the on-state voltage of the low-side device (S2) and $V_F$ is the forward voltage drop of the diode D21. As the high-side device (S1) is off during this period, the node voltage at node 11 measures a constant voltage $V_C+V_F$. The constant voltage $V_C$ is known and defined by the Zener diodes (DZ1, DZ2), series connected diodes (D12, D22), series resistors (R1, R2) and the power supplies $(+V_{DD}, -V_{DD})$.

Referring again to FIG. 10, the second stage measures the diode (D12 & D22) forward voltage drop with differential amplifier circuits. The voltage drop across these diodes are expected to be same as the voltage drop across diodes D11 and D21 respectively when the same current flows through them, which is the case during the on-state. In the third state, a differential amplifier subtracts the measured forward voltage drop from the first stage measurement to get $V_{ON}$. The fourth stage of the sensor combines the signals from the low-side and high-side circuits (node 13 and 23). The combined signal contains $V_{ON}$ of either the high-side or the low-side device whichever is in the on-state and the constant voltage $V_C$.

Figure 12:
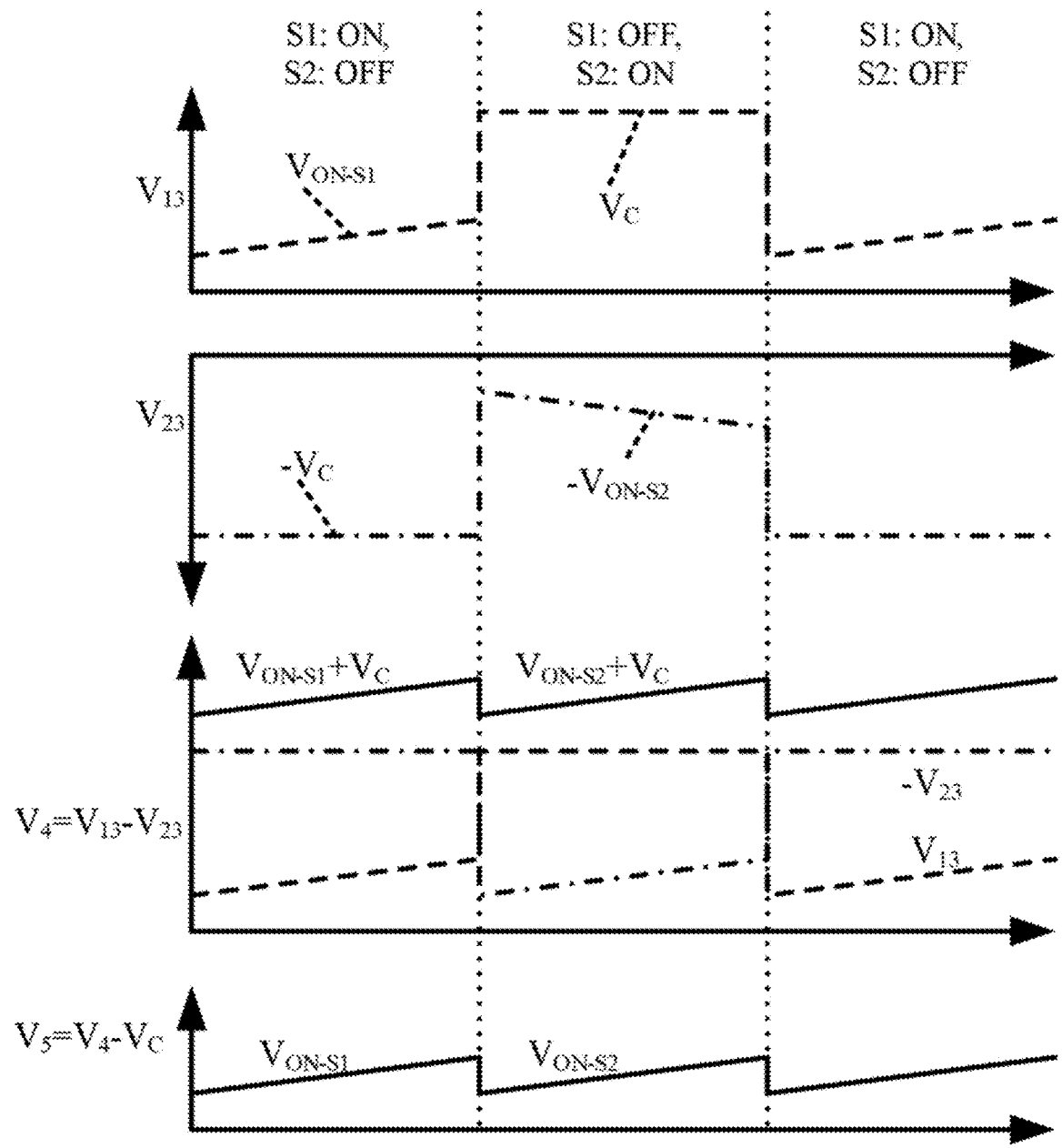
FIG. 12 illustrates examples of waveforms at different nodes of the HB on-state voltage sensor, in accordance with various embodiments of the present disclosure.

In the fifth stage, an offset voltage generator generates a voltage equal to $V_C$, the voltage offset present at the output of the fourth stage. This voltage offset is then subtracted from $V_4$ to get the final $V_{ON}$, $V_5$. The final $V_{ON}$ contains $V_{ON}$ of the device which is in the on-state. The sixth stage is an isolation stage, which translates the final output to the control circuit reference so that the final $V_{ON}$ sensing output can be connected to a DSP or and ADC input pin for further in-situ health monitoring. The operation and the output of each of the signal stages are presented in Table IV. The node voltages are named in reference to the nodes illustrated in FIG. 10. The fundamental operating principle and the ideal waveforms of the HB $V_{ON}$ sensor at some major nodes and the final output of the sensor is presented in FIG. 12.

TABLE IV

Analog Circuit Operation at Different Nodes

| Analog circuit operation | Output node | S1: ON, S2: OFF | S1: OFF, S2: ON |
|---|---|---|---|
| Voltage clamp circuit | 11 | $V_{ON\text{-}S1} + V_F$ | $V_C + V_F$ |
|  | 21 | $-(V_C + V_F)$ | $-(V_{ON\text{-}S2} + V_F)$ |
| Diode forward voltage measurement | 12 | $V_F$ | $V_F$ |
|  | 22 | $V_F$ | $V_F$ |
| $V_{11}$-$V_{12}$ | 13 | $V_{ON\text{-}S1}$ | $V_C$ |
| $V_{21}$-$V_{22}$ | 23 | $-V_C$ | $-V_{ON\text{-}S2}$ |
| $V_{13}$-$V_{23}$ | 4 | $V_{ON\text{-}S1} + V_C$ | $V_{ON\text{-}S2} + V_C$ |
| $V_4$-$V_C$ | 5 | $V_{ON\text{-}S1}$ | $V_{ON\text{-}S2}$ |
| Isolation | 6 | $V_{ON\text{-}S1}$ | $V_{ON\text{-}S2}$ |

Experiment Results

The HBV$_{ON}$ sensor has been designed and integrated with the gate driver board for a 1200V SiC HB module. The PCB board hardware prototype is shown in the image of FIG. 9.

Individual validation of the circuit stages of the $V_{ON}$ sensor were completed prior to $V_{ON}$ performance evaluation under switching.

Sensor Performance Validation Under DC conditions. First, the on-state voltage accuracy of the sensor was quantified under DC conditions. To calculate the accuracy of sensor reading at the entire range of input, the configuration presented in FIGS. 13A and 13B was used, where both of the devices were kept in the off-state and a variable resistor was connected across one of the two devices. The variable resistor was used to create a small voltage across the input terminals of the $V_{ON}$ sensor under test and was varied to get a voltage from 0V to 2V at the input terminals. When the variable resistor is connected to the high-side of the sensor, it represents a situation where the low-side device is in the off-state and the high-side device is in the on-state. Similarly, when the variable resistor is connected to the low-side of the sensor, it represents a situation when the high-side device is in the off-state and the low-side device is in the on-state. FIGS. 13A and 13B illustrate sensor characteristics for different $V_{ON}$ of the high-side and low-side MOSFETs up to 2V. In FIG. 13A the input is applied to the high-side, with the low-side turned off, and in FIG. 13B the input is applied to the low-side, with the high-side turned off.

Although in both cases, both the high-side and low-side devices are in the off-state, this configuration provides a small, temperature independent DC voltage across one SiC FET of the half bridge module, and a large DC voltage across the other side as series operation of benchtop supplies is discouraged at hundreds of volts. At every input voltage, the voltages at different sensor nodes were recorded and presented in Table V and Table VI. Table V presents the measurements and accuracy of the high-side $V_{ON}$ sensor and Table VI presents the measurements and accuracy of the low-side $V_{ON}$ sensor. From the DC measurements, it can be seen that the non-isolated final output has a very small error (<4%) for input voltages of 0.58 V or higher. At lower input voltages the error is relatively large which may be attributed to low signal-to noise ratio. The isolated output of the sensor also has very small error (<4%) for inputs from 0.58V or higher. These errors, however, could be adjusted with appropriate calibration with the data presented in the tables.

TABLE V

DC Characteristics of the Sensor, High-Side Device as DUT and Low-Side Device Turned Off

| Input | Final Output | Error | | Isolated | Error in Isolated output | |
|---|---|---|---|---|---|---|
| (V) | (V5) (V) | V | % | Output | V | % |
| 0.106 | 0.128 | 0.022 | 20.75% | 0.092 | 0.014 | 13% |
| 0.308 | 0.332 | 0.024 | 7.79% | 0.292 | 0.016 | 5% |
| 0.577 | 0.600 | 0.023 | 3.99% | 0.557 | 0.020 | 3% |
| 0.915 | 0.937 | 0.022 | 2.40% | 0.890 | 0.025 | 3% |
| 1.359 | 1.377 | 0.018 | 1.32% | 1.326 | 0.033 | 2% |
| 1.645 | 1.657 | 0.012 | 0.73% | 1.603 | 0.042 | 3% |
| 1.799 | 1.807 | 0.008 | 0.44% | 1.752 | 0.047 | 3% |
| 2.014 | 2.017 | 0.003 | 0.15% | 1.958 | 0.056 | 3% |

TABLE VI

DC Characteristics of the Sensor, Low-Side Device as DUT and High-Side Device Turned Off

| Input | Final Output | Error | | Isolated Output | Error in Isolated output | |
|---|---|---|---|---|---|---|
| (V) | (V5) (V) | V | % | (V) | V | % |
| 0.106 | 0.128 | 0.022 | 20.7% | 0.086 | 0.020 | 19% |
| 0.310 | 0.332 | 0.022 | 7.10% | 0.292 | 0.018 | 6% |
| 0.582 | 0.602 | 0.020 | 3.44% | 0.559 | 0.023 | 4% |
| 0.924 | 0.941 | 0.017 | 1.84% | 0.896 | 0.028 | 3% |
| 1.370 | 1.382 | 0.012 | 0.88% | 1.332 | 0.038 | 3% |
| 1.652 | 1.660 | 0.008 | 0.48% | 1.605 | 0.047 | 3% |
| 1.803 | 1.807 | 0.004 | 0.22% | 1.752 | 0.051 | 3% |
| 2.016 | 2.014 | 0.002 | 0.10% | 1.955 | 0.061 | 3% |

Figure 15A:
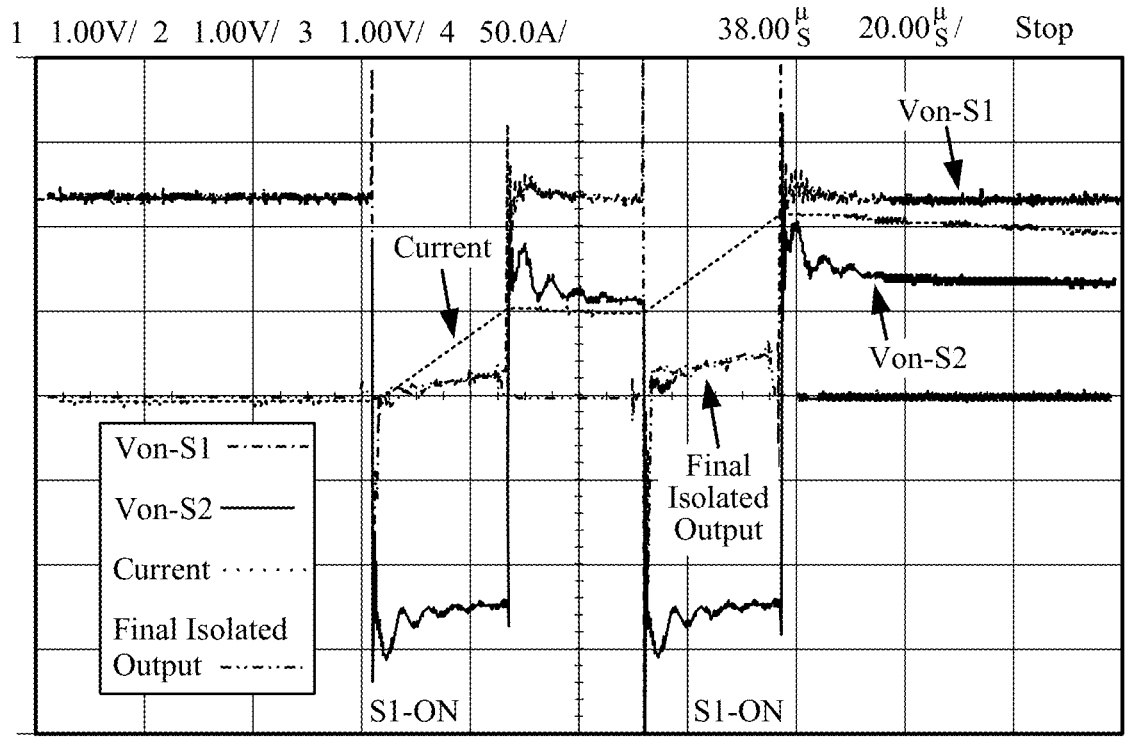
FIGS. 15A and 15B illustrate examples of DPT waveforms, in accordance with various embodiments of the present disclosure.
Figure 15B:
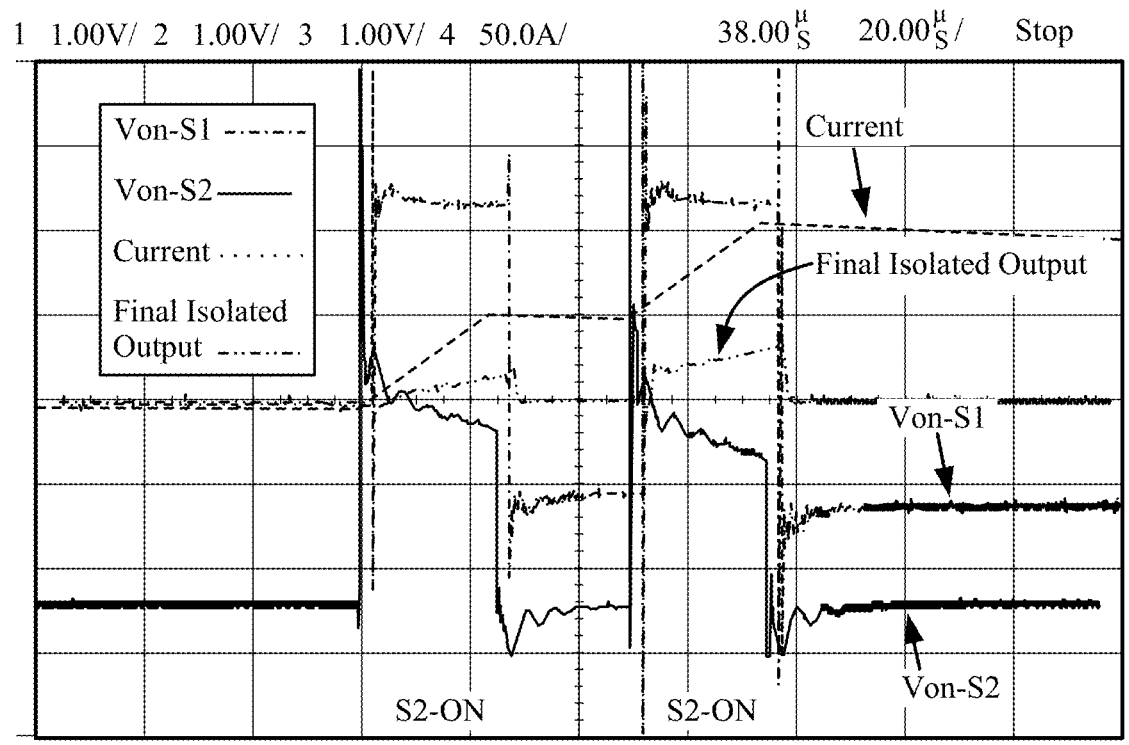

Sensor Performance Validation in Double Pulse Test. In addition, to quantifying the accuracy under DC condition, the sensor performance was evaluated under switching conditions as well. To evaluate dynamic performance, a double pulse test (DPT) is conducted. In the DPT, one device is used as the device under test (DUT) while keeping the other in the off-state. The circuit configurations for the DPT tests are presented in FIGS. 14A and 14B. In the DPT experiment setup configuration of FIG. 14A, the high-side device is the DUT keeping the low-side device off, and in FIG. 14B the low-side device is the DUT keeping the high-side device off. All the major sensing nodes are recorded with a 200V input DC bus. Oscilloscope DPT waveform captures at different nodes are presented in FIGS. 15A and 15B. Only one device was used as the DUT at a time while keeping the other device turned off. When the high-side device is used as the DUT, the high-side sensing part of the $HBV_{ON}$ sensor measures the $V_{ON}$ of the high-side device during its on-state while the low-side sensing part measures a constant voltage. FIG. 15A shows the high-side device S1 used as the DUT and FIG. 15B shows the low-side device S2 used as the DUT. The test was conducted at 200V DC bus voltage.

After addition and offset compensation, the final isolated output of the $HBV_{ON}$ sensor provides the $V_{ON}$ of the high-side device. During the off-state of the DUT, the high-side sensing part of the sensor measures a constant voltage, but the low-side sensing part of the device measures negative voltage as current flows through the body diode of the low-side device during this period. This negative voltage is clamped at the final sensor output. Thus, the final sensor output provides the $V_{ON}$ of the high-side device when it is ON and a zero voltage when it is OFF. The sensor currently measures only positive voltage drop from drain to source of a MOSFET, but can be redesigned to measure voltage in the opposite direction as well. Similarly, when the low-side device is used as the DUT, the sensor final output provides $V_{ON}$ of the low-side device when it is ON and a zero voltage when it is OFF.

Figure 16A:
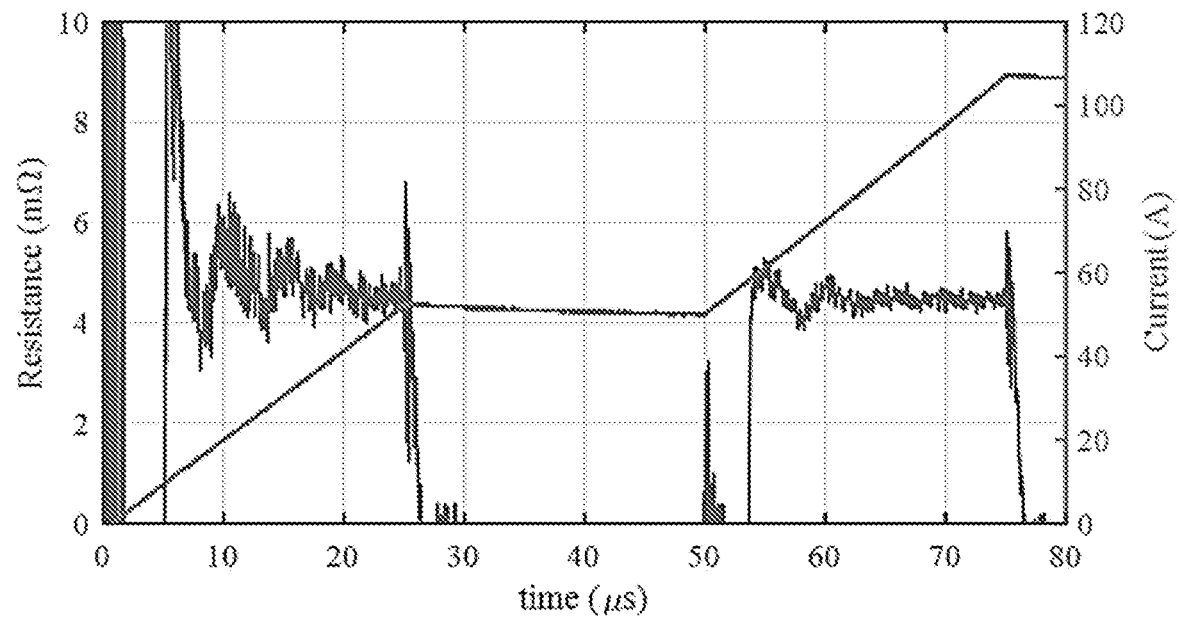
FIGS. 16A and 16B illustrate examples of measured current information and on-state resistance (Rory) of the DUTs using the HB Von output, in accordance with various embodiments of the present disclosure.
Figure 16B:
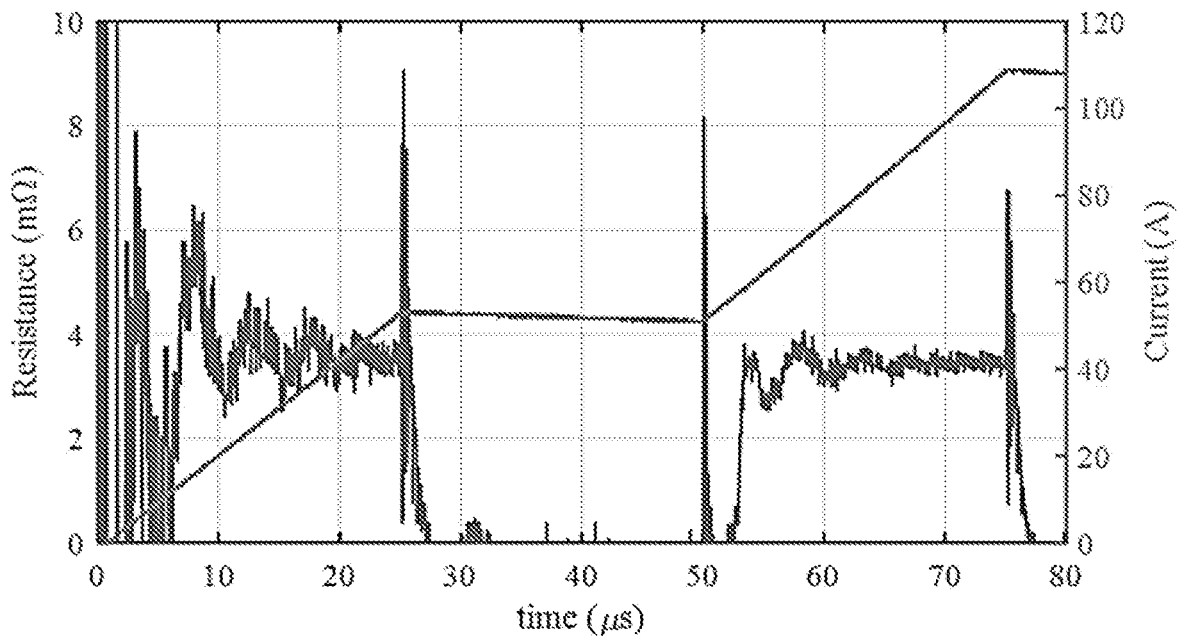

Using the measured $V_{ON}$ and the current information from the captured data, the on-state resistance ($R_{ON}$) of the DUTs are calculated and presented in FIGS. 16A and 16B. A CREE 1200V module CAS300M12BM2 was used for the DPT. The reported on-state resistance of this module in the datasheet is from 4.17 mΩ (typical) to 5.67 mΩ (max). Calculated on-state resistance using the output of the $HBV_{ON}$ sensor and current reading from a Tektronix current probe was found to be in the same range. FIG. 16A shows the high-side device as DUT and FIG. 16B shows the low-side device as DUT. The exact accuracy of the calculated resistance is not reported from the test as the true $R_{ON}$ of the module was not measured using any other tools for reference. Even if the exact accuracy is not reported, the measured $R_{ON}$ is well within the datasheet provided range.

Figure 17:
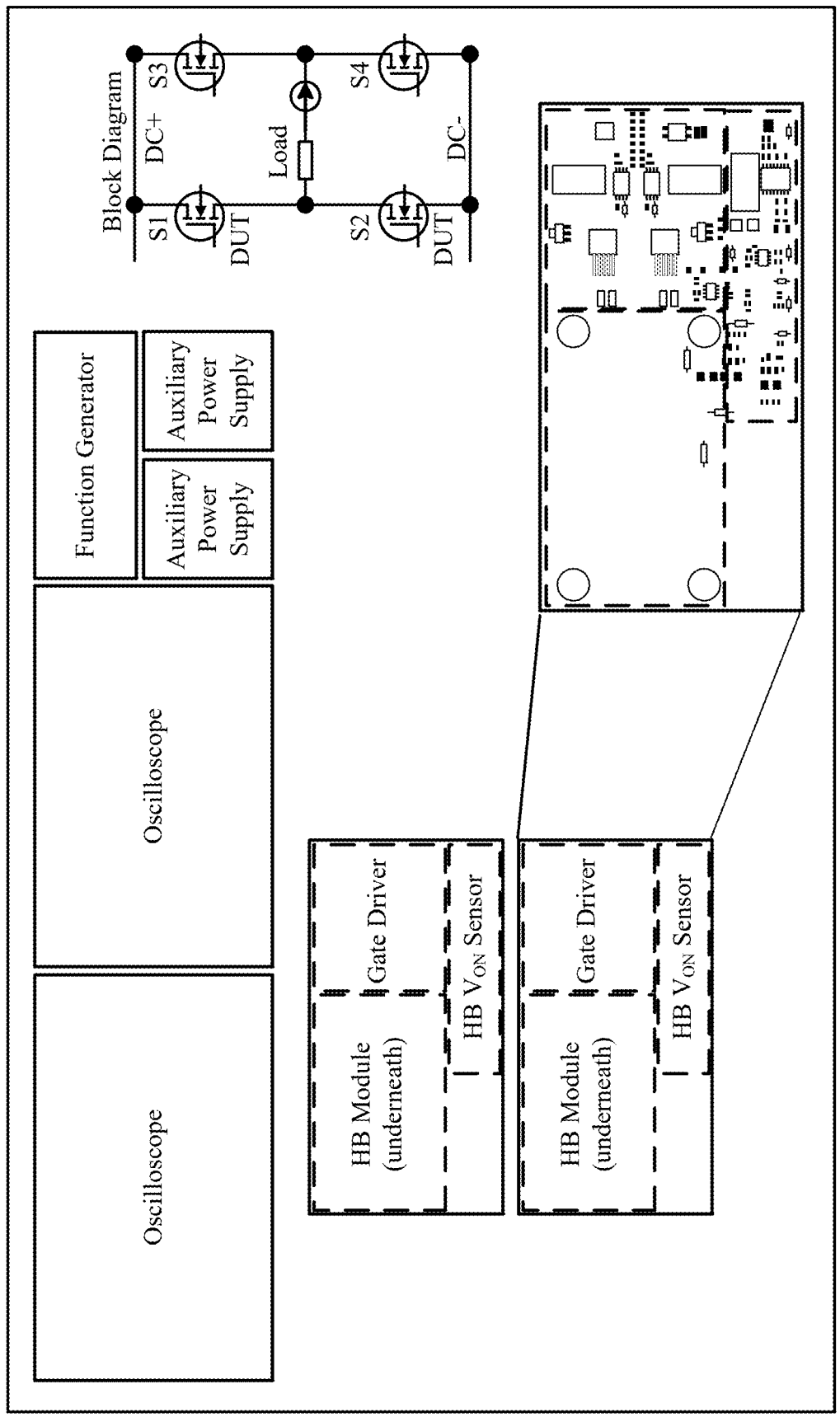
FIG. 17 is an image showing an experiment setup of the HB on-state voltage sensor, in accordance with various embodiments of the present disclosure.

Application of the HB $V_{ON}$ Sensor in an Inverter. The final experiment was conducted with the $HBV_{ON}$ sensor when the HB was used in a practical operation where the high-side and low-side devices were turned-on and off in a complimentary manner. In this test, for a half-cycle, the high-side device was turned ON and, for the remaining half-cycle, the low-side device was turned ON. FIG. 17 is an image showing the experiment setup of $HBV_{ON}$ sensor in a single-phase full bridge inverter. The test setup was built as a full-bridge (FB) configuration with series inductor and resistor load connected between the two HBs as presented on the right-side of FIG. 17. This FB circuit was built to represent a real-world application of two HB modules as a single-phase inverter. The $HBV_{ON}$ sensor was connected to two DUTs (S1 and S2) of one of the two modules. The FB was controlled in a complementary switching manner (i.e., S1 and S4 were turned on/off together while S2 and S3 together were in the complementary state).

Figure 18A:
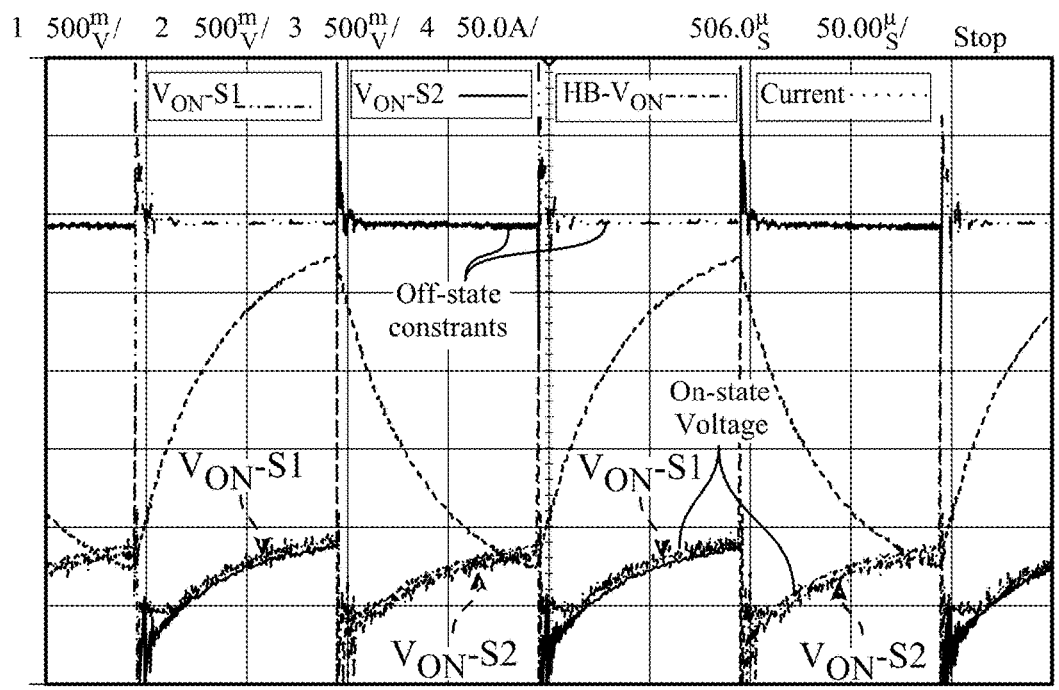
FIGS. 18A and 18B illustrate examples of the experimental results, in accordance with various embodiments of the present disclosure.
Figure 18B:
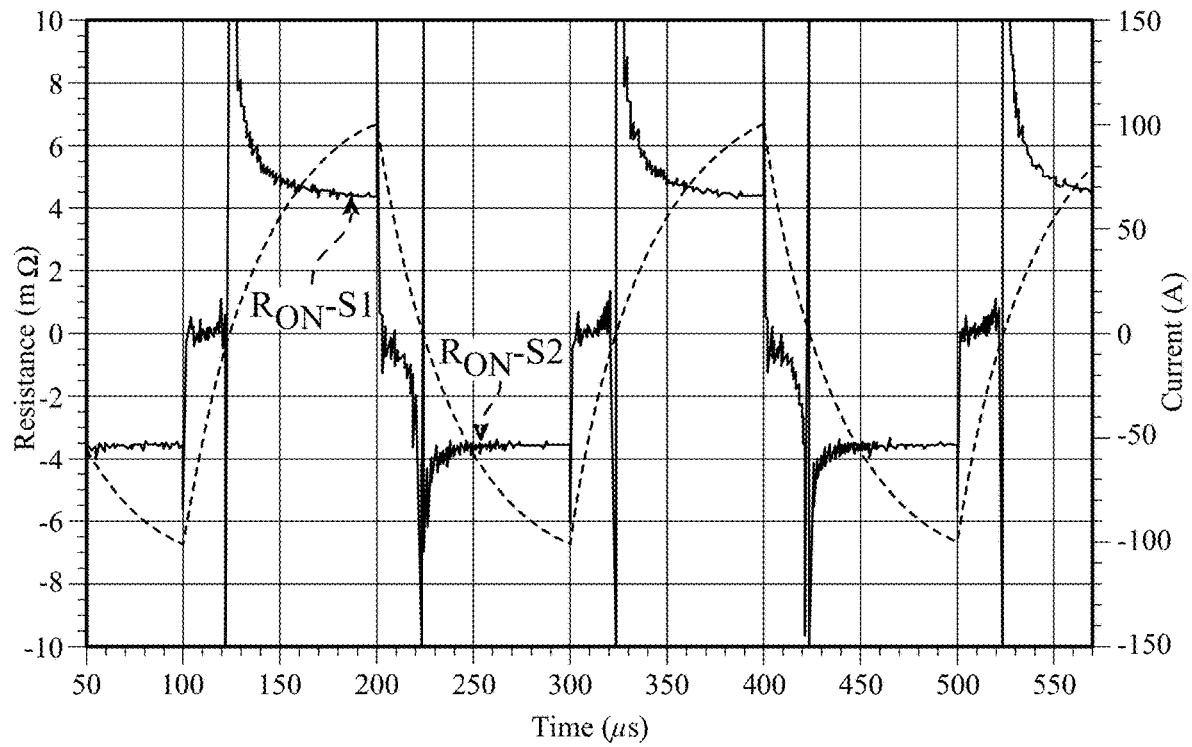

FIGS. 18A and 18B illustrate examples of the experimental results in a single-phase inverter operated at 400V DC, with the individual $V_{ON}$ of the high-side and low-side MOSFETs, and the final sensor output containing $V_{ON}$ of both devices shown in FIG. 18A and calculated $R_{ON}$ using the final isolated $V_{ON}$ and inductor current shown in FIG. 18B. The negative value of $R_{ON}$ is due to the negative value of current measurement for the low-side device. FIG. 18A presents the sensor waveforms of the high-side $V_{ON}$ and low-side $V_{ON}$ as well as the combined sensor output that contains $V_{ON}$ of two DUTs depending on their ON status. The intermediate sensor node that measures the individual $V_{ON}$ of the high-side and low-side devices show the $V_{ON}$ during their on-state and a constant voltage during their off-state. The final output does not have the offset and contains $V_{ON}$ of both devices as only one device was in the on-state at a time. The final sensor output was used to calculate the $R_{ON}$ of the both DUTs. FIG. 18B presents the calculated $R_{ON}$ of both devices. The same inductor current was used to calculate the $R_{ON}$. The inductor current is in the same direction as the current through the high-side device (S1) but in the opposite direction to the current through the low-side device (S2). Therefore, calculated Rory of the low-side device is represented as negative which is due to the negative sign of the current. Calculated Rory of both devices are very close to the DPT results and within the range of values provided in the datasheet.

An application oriented on-state voltage sensor for HB architecture that provides $V_{ON}$ of both the high-side and low-side devices in a single sensor output has been presented. The proposed sensor reduces the number of signal processing channels which makes system level implementations easier compared to solutions available at present. The architecture also allows the sensor to be integrated with the gate driving circuit for a compact system design. A $HBV_{ON}$ sensor prototype was designed with the proposed circuit and integrated with the gate driver for SiC HB modules. Experiment results have been presented under DC and dynamic conditions The output has less than 4% error for voltages 0.5V and higher. Rory calculations have been presented using the $HBV_{ON}$ output for a SiC HB. Calculated $R_{ON}$ falls within the datasheet provided information thus validating the sensor performance.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. An on-state voltage measurement circuit, comprising:
a first clamping circuit comprising:
a first high-side voltage clamping circuit coupled across a first high-side switching device of a first half-bridge leg of a converter, the first high-side voltage clamping circuit comprising a first high-side first diode coupled in series with a first high-side second diode, an anode of the first high-side first diode connected to a first source of the first high-side switching device, a cathode of the first high-side first diode coupled to an anode of the first high-side second diode at a first clamped point between the first high-side first diode and the first high-side second diode, wherein the first clamped point is coupled to a positive DC bus via a first Zener diode; and
a first low-side voltage clamping circuit coupled across a first low-side switching device of the first half-bridge leg of the converter, the first low-side voltage clamping circuit comprising a first low-side first diode coupled in series with a first low-side second diode, a cathode of the first low-side first diode connected to a first drain of the first low-side switching device, an anode of the first low-side first diode coupled to a cathode of the first low-side second diode at a second clamped point between the first low-side first diode and the first low-side second diode, wherein the second clamped point is coupled to a negative DC bus via a second Zener diode;
a first on-state voltage circuit coupled to the first clamping circuit comprising:
a first high-side voltage measurement circuit configured to provide a first non-isolated high-side on-state voltage based upon the first clamped point voltage and a first forward voltage measured across the first high-side second diode of the first high-side voltage clamping circuit, referenced to the positive DC bus of the converter; and a first low-side voltage measurement circuit configured to provide a first non-isolated low-side on-state voltage based upon the second clamped point voltage and a second forward voltage measured across the first low-side second diode of the low-side voltage clamping circuit, referenced to the negative DC bus of the converter; and an output circuit coupled to the on-state voltage circuit comprising:
a first high-side isolation circuit configured to provide a first isolated high-side on-state voltage with reference to a control ground of the converter from the first non-isolated high-side on-state voltage; and
a first low-side isolation circuit configured to provide a first isolated low-side on-state voltage with reference to the control ground from the first non-isolated low-side on-state voltage.

2. The on-state voltage measurement circuit of claim 1, wherein the first high-side voltage clamping circuit is referenced to the positive DC bus via a first isolated power supply and the first low-side voltage clamping circuit is referenced to the negative DC bus via a second isolated power supply.

3. The on-state voltage measurement circuit of claim 2, wherein the first isolated power supply is connected in parallel with a first capacitor and in series with a first resistor and the second isolated power supply is connected in parallel with a second capacitor and in series with a second resistor.

4. The on-state voltage measurement circuit of claim 1, further comprising a phase current sensor associated with the first half-bridge leg, wherein on-state resistances of the high-side and low side switching devices are determined based upon the isolated high-side and low-side on-state voltages and corresponding phase currents measured by the phase current sensor.

5. The on-state voltage measurement circuit of claim 1, wherein the first high-side voltage measurement circuit comprises a first differential amplifier configured to measure the first forward voltage across the first high-side second diode and a second differential amplifier configured to provide the non-isolated high-side on-state voltage by subtracting the first forward voltage from the first clamped point voltage.

6. The on-state voltage measurement circuit of claim 1, wherein the first low-side voltage measurement circuit comprises a third differential amplifier configured to measure the second forward voltage across the first low-side second diode and a fourth differential amplifier configured to provide the non-isolated low-side on-state voltage by subtracting the second forward voltage from the second clamped point voltage.

7. The on-state voltage measurement circuit of claim 1, wherein the high-side isolation circuit comprises an isolator configured to provide the isolated high-side on-state voltage based upon the non-isolated high-side on-state voltage referenced to the positive DC bus.

8. The on-state voltage measurement circuit of claim 1, wherein the low-side isolation circuit comprises an isolator configured to provide the isolated low-side on-state voltage based upon the non-isolated low-side on-state voltage referenced to the negative DC bus.

9. The on-state voltage measurement circuit of claim 1, further comprising:

a second clamping circuit comprising:
a second high-side voltage clamping circuit coupled across a second high-side switching device of a second half-bridge leg of the converter, the second high-side voltage clamping circuit comprising a second high-side first diode coupled in series with a second high-side second diode, an anode of the second high-side first diode connected to a second source of the second high-side switching device, a cathode of the second high-side first diode coupled to an anode of the second high-side second diode at a third clamped point between the second high-side first diode and the second high-side second diode, wherein the third clamped point is coupled to the positive DC bus via a third Zener diode; and
a second low-side voltage clamping circuit coupled across a second low-side switching device of the second half-bridge leg of the converter, the second low-side voltage clamping circuit comprising a second low-side first diode coupled in series with a second low-side second diode, a cathode of the second low-side first diode connected to a second drain of the second low-side switching device, an anode of the second low-side first diode coupled to a cathode of the second low-side second diode at a fourth clamped point between the second low-side first diode and the second low-side second diode, wherein the fourth clamped point is coupled to the negative DC bus via a fourth Zener diode; and a second on-state voltage circuit coupled to the second clamping circuit comprising:
a second high-side voltage measurement circuit configured to provide a second non-isolated high-side on-state voltage based upon the third clamped point voltage and a third forward voltage measured across the second high-side second diode referenced to the positive DC bus of the converter; and
a second low-side voltage measurement circuit configured to provide a second non-isolated low-side on-state voltage based upon the fourth clamped point voltage and a fourth forward voltage measured across the second low-side second diode referenced to the negative DC bus of the converter.

10. The on-state voltage measurement circuit of claim 9, wherein a second high-side isolation circuit is configured to further provide a second isolated high-side on-state voltage with reference to the control ground of the converter from the second non-isolated high-side on-state voltage; and a second low-side isolation circuit is configured to further provide a second isolated low-side on-state voltage with reference to the control ground from the second non-isolated low-side on-state voltage.

11. The on-state voltage measurement circuit of claim 9, further comprising:

a third clamping circuit comprising:
a third high-side voltage clamping circuit coupled across a third high-side switching device of a third half-bridge leg of the converter, the third high-side voltage clamping circuit comprising a third high-side first diode coupled in series with a third high-side second diode, an anode of the third high-side first diode connected to a third source of the third high-side switching device, a cathode of the third high-side first diode coupled to an anode of the third high-side second diode at a fifth clamped point between the third high-side first diode and the third high-side second diode, wherein the fifth clamped point is coupled to the positive DC bus via a fifth Zener diode; and a third low-side voltage clamping circuit coupled across a third low-side switching device of the third half-bridge leg of the converter, the third low-side voltage clamping circuit comprising a third low-side first diode coupled in series with a third low-side second diode, a cathode of the third low-side first diode connected to a third drain of the third low-side switching device, an anode of the third low-side first diode coupled to a cathode of the third low-side second diode at a sixth clamped point between the third low-side first diode and the third low-side second diode, wherein the sixth clamped point is coupled to the negative DC bus via a sixth Zener diode; and a third on-state voltage circuit coupled to the third clamping circuit comprising:

a third high-side voltage measurement circuit configured to provide a third non-isolated high-side on-state voltage based upon the fifth clamped point voltage and a fifth forward voltage measured across the third high-side second diode referenced to the positive DC bus of the converter; and a third low-side voltage measurement circuit configured to provide a third non-isolated low-side on-state voltage based upon the sixth clamped point voltage and a sixth forward voltage measured across the third low-side second diode referenced to the negative DC bus of the converter.

12. The on-state voltage measurement circuit of claim 11, wherein a third high-side isolation circuit is configured to further provide a third isolated high-side on-state voltage with reference to the control ground of the converter from the third non-isolated high-side on-state voltage; and a third low-side isolation circuit is configured to further provide a third isolated low-side on-state voltage with reference to the control ground from the third non-isolated low-side on-state voltage.

13. The on-state voltage measurement circuit of claim 11, further comprising:

a fourth clamping circuit comprising:

a fourth high-side voltage clamping circuit coupled across a fourth high-side switching device of a fourth half-bridge leg of the converter, the fourth high-side voltage clamping circuit comprising a fourth high-side first diode coupled in series with a fourth high-side second diode, an anode of the fourth high-side first diode connected to a fourth source of the fourth high-side switching device, a cathode of the fourth high-side first diode coupled to an anode of the fourth high-side second diode at a seventh clamped point between the fourth high-side first diode and the fourth high-side second diode, wherein the seventh clamped point is coupled to the positive DC bus via a seventh Zener diode; and a fourth low-side voltage clamping circuit coupled across a fourth low-side switching device of the fourth half-bridge leg of the converter, the fourth low-side voltage clamping circuit comprising a fourth low-side first diode coupled in series with a fourth low-side second diode, a cathode of the fourth low-side first diode connected to a fourth drain of the fourth low-side switching device, an anode of the fourth low-side first diode coupled to a cathode of the fourth low-side second diode at an eighth clamped point between the fourth low-side first diode and the fourth low-side second diode, wherein the eighth clamped point is coupled to the negative DC bus via an eighth Zener diode; and a fourth on-state voltage circuit coupled to the fourth clamping circuit comprising:

a fourth high-side voltage measurement circuit configured to provide a fourth non-isolated high-side on-state voltage based upon the seventh clamped point voltage and a seventh forward voltage measured across the fourth high-side second diode referenced to the positive DC bus of the converter; and a fourth low-side voltage measurement circuit configured to provide a fourth non-isolated low-side on-state voltage based upon the eighth clamped point voltage and an eighth forward voltage measured across the fourth low-side second diode referenced to the negative DC bus of the converter.

14. The on-state voltage measurement circuit of claim 13, wherein a fourth high-side isolation circuit is configured to further provide a fourth isolated high-side on-state voltage with reference to the control ground of the converter from the fourth non-isolated high-side on-state voltage; and a fourth low-side isolation circuit is configured to further provide a fourth isolated low-side on-state voltage with reference to the control ground from the fourth non-isolated low-side on-state voltage.

\* \* \* \* \*